United States Patent
Bubel et al.

(10) Patent No.: US 12,438,001 B1
(45) Date of Patent: Oct. 7, 2025

(54) OFF AXIS LASER-BASED SURFACE PROCESSING OPERATIONS FOR SEMICONDUCTOR WAFERS

(71) Applicant: Wolfspeed, Inc., Durham, NC (US)

(72) Inventors: Simon Bubel, Carrboro, NC (US); Josephus Daniel Ferguson, Apex, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/628,246

(22) Filed: Apr. 5, 2024

(51) Int. Cl.
*H01L 21/04* (2006.01)
*H01L 21/268* (2006.01)
*H01L 21/67* (2006.01)

(52) U.S. Cl.
CPC ........ *H01L 21/0475* (2013.01); *H01L 21/268* (2013.01); *H01L 21/67092* (2013.01)

(58) Field of Classification Search
CPC ............... H01L 21/0475; H01L 21/268; H01L 21/67092
See application file for complete search history.

(56) References Cited

U.S. PATENT DOCUMENTS

| | | | | |
|---|---|---|---|---|
| 5,643,472 A | * | 7/1997 | Engelsberg | B23K 26/142 |
| | | | | 219/121.84 |
| 6,048,588 A | * | 4/2000 | Engelsberg | B08B 7/0042 |
| | | | | 219/121.84 |
| 7,173,285 B2 | * | 2/2007 | Hallin | C30B 25/105 |
| | | | | 438/105 |
| 7,226,805 B2 | * | 6/2007 | Hallin | H01L 21/02529 |
| | | | | 257/E21.054 |
| 7,396,410 B2 | * | 7/2008 | Hallin | C30B 25/105 |
| | | | | 438/105 |

(Continued)

FOREIGN PATENT DOCUMENTS

| | | | | |
|---|---|---|---|---|
| CA | 2940050 C | * | 10/2023 | ........... C01B 32/184 |
| CN | 105933685 A | * | 9/2016 | ........... H04N 9/3141 |

(Continued)

OTHER PUBLICATIONS

Aixtron, "The First Domestic Silicon Carbide Ingot Laser Stripping Equipment was put into Production", Aug. 28, 2024, Morning News, https://www.compoundsemiconductorchina.net/industry-news.asp?id=6308, retrieved on Sep. 10, 2024 with machine translation, 4 pages.

(Continued)

*Primary Examiner* — Laura M Menz
(74) *Attorney, Agent, or Firm* — Dority & Manning, P.A.

(57) ABSTRACT

Systems and methods for laser-based surface processing operations on a semiconductor wafer, such as a silicon carbide semiconductor wafer, are provided. In one example, a method includes providing a semiconductor workpiece having a surface. The method includes providing emission of one or more lasers to the surface of a semiconductor workpiece at a non-perpendicular incidence angle relative to the surface. The method includes imparting relative motion between the one or more lasers and the semiconductor workpiece while providing emission of the one or more lasers to the surface of the semiconductor workpiece at the non-perpendicular incidence angle.

20 Claims, 17 Drawing Sheets

(56) References Cited

U.S. PATENT DOCUMENTS

| | | | | |
|---|---|---|---|---|
| 7,601,986 | B2 * | 10/2009 | Hallin | C30B 29/36 438/105 |
| 9,279,192 | B2 * | 3/2016 | Hansen | C30B 23/02 |
| 10,002,760 | B2 * | 6/2018 | Hansen | H01L 21/02529 |
| 10,226,835 | B2 * | 3/2019 | Matsuura | B23K 26/0861 |
| 10,319,593 | B2 * | 6/2019 | Hirata | B23K 26/0853 |
| 10,319,594 | B2 * | 6/2019 | Hirata | B23K 26/60 |
| 10,562,130 | B1 * | 2/2020 | Donofrio | B23K 26/032 |
| 10,576,585 | B1 * | 3/2020 | Donofrio | B23K 26/0006 |
| 10,611,052 | B1 * | 4/2020 | Bubel | H10D 62/8325 |
| 10,896,815 | B2 * | 1/2021 | Seddon | H01L 21/02013 |
| 10,903,078 | B2 * | 1/2021 | Schulze | H01L 21/02378 |
| 11,034,056 | B2 * | 6/2021 | Bubel | H10D 62/8325 |
| 11,219,966 | B1 * | 1/2022 | Donofrio | B23K 26/53 |
| 11,289,378 | B2 * | 3/2022 | Schneider | H01L 21/78 |
| 11,373,859 | B2 * | 6/2022 | Seddon | C30B 33/06 |
| 11,519,098 | B2 * | 12/2022 | Khlebnikov | C30B 29/36 |
| 11,654,596 | B2 * | 5/2023 | Bubel | H10D 62/8325 225/2 |
| 11,772,201 | B2 * | 10/2023 | Richter | B23K 26/0006 219/121.72 |
| 11,826,846 | B2 * | 11/2023 | Donofrio | H01L 21/02021 |
| 11,911,842 | B2 * | 2/2024 | Donofrio | B28D 5/0005 |
| 12,054,850 | B2 * | 8/2024 | Khlebnikov | C30B 33/06 |
| 12,070,875 | B2 * | 8/2024 | Bubel | B28D 5/0011 |
| 2005/0205871 | A1 * | 9/2005 | Hallin | C30B 25/02 257/77 |
| 2005/0205872 | A1 * | 9/2005 | Hallin | H01L 21/02529 257/77 |
| 2006/0032434 | A1 * | 2/2006 | Mueller | C30B 29/36 117/200 |
| 2006/0057850 | A1 * | 3/2006 | Britt | H01L 21/6836 257/E23.179 |
| 2006/0243985 | A1 * | 11/2006 | Hallin | H01L 21/0243 438/105 |
| 2007/0101930 | A1 * | 5/2007 | Hallin | C30B 25/02 117/101 |
| 2007/0105349 | A1 * | 5/2007 | Hallin | H01L 21/02529 438/478 |
| 2010/0311225 | A1 * | 12/2010 | Sekiya | B23K 26/40 257/E21.599 |
| 2014/0024199 | A1 * | 1/2014 | Qiu | H01L 21/6836 438/462 |
| 2017/0025275 | A1 * | 1/2017 | Hirata | H01L 21/6836 |
| 2017/0025276 | A1 * | 1/2017 | Hirata | B24B 7/228 |
| 2017/0204532 | A1 * | 7/2017 | Land | C04B 35/571 |
| 2019/0326117 | A1 * | 10/2019 | Seddon | H01L 21/02016 |
| 2019/0337100 | A1 * | 11/2019 | Richter | H01L 21/78 |
| 2019/0362960 | A1 * | 11/2019 | Seddon | C30B 29/36 |
| 2019/0362972 | A1 * | 11/2019 | Schulze | H01L 21/02378 |
| 2020/0361121 | A1 * | 11/2020 | Bubel | B28D 5/0011 |
| 2021/0118666 | A1 * | 4/2021 | Seddon | H01L 21/02013 |
| 2021/0170632 | A1 * | 6/2021 | Bubel | H10D 62/8325 |
| 2021/0198804 | A1 * | 7/2021 | Khlebnikov | C30B 33/04 |
| 2021/0375620 | A1 * | 12/2021 | Ahmed | H10D 84/0112 |
| 2022/0126395 | A1 * | 4/2022 | Donofrio | H01L 22/12 |
| 2022/0189768 | A1 * | 6/2022 | Khlebnikov | H01L 21/02378 |
| 2022/0254916 | A1 * | 8/2022 | Miyazato | H10D 30/668 |
| 2022/0403552 | A1 * | 12/2022 | Leonard | H10H 20/826 |
| 2023/0133459 | A1 * | 5/2023 | Tanaka | H10D 62/53 257/77 |
| 2023/0241803 | A1 * | 8/2023 | Bubel | H10D 62/8325 225/2 |
| 2024/0113235 | A1 * | 4/2024 | Potera | H01L 21/266 |
| 2024/0189940 | A1 * | 6/2024 | Donofrio | B28D 5/0064 |
| 2024/0266419 | A1 * | 8/2024 | King | H01L 21/02439 |
| 2024/0274660 | A1 * | 8/2024 | Van Brunt | H10D 62/102 |
| 2024/0352622 | A1 * | 10/2024 | Khlebnikov | C30B 23/02 |
| 2024/0367348 | A1 * | 11/2024 | Bubel | H10D 62/8325 |
| 2024/0413129 | A1 * | 12/2024 | Choi | H01L 25/0753 |

FOREIGN PATENT DOCUMENTS

| | | | | |
|---|---|---|---|---|
| CN | 205864631 | U * | 1/2017 | |
| CN | 115338546 | A * | 11/2022 | B23K 26/0093 |
| DE | 102018001327 | A1 * | 8/2019 | B23K 26/0006 |
| DE | 102021210199 | A1 * | 3/2022 | B23K 26/0006 |
| EP | 3969239 | B1 * | 12/2023 | B28D 5/0011 |
| EP | 4342648 | A1 * | 3/2024 | B28D 5/0011 |
| EP | 3902652 | B1 * | 5/2024 | B23K 26/0006 |
| EP | 4389343 | A2 * | 6/2024 | B23K 26/0006 |
| EP | 3902653 | B1 * | 7/2024 | B23K 26/032 |
| EP | 4403293 | A2 * | 7/2024 | B23K 26/032 |
| JP | 7312833 | B2 * | 7/2023 | B23K 26/0006 |
| JP | 7315677 | B2 * | 7/2023 | B23K 26/032 |
| JP | 2023134793 | A * | 9/2023 | B28D 5/0011 |
| JP | 2023139058 | A * | 10/2023 | B23K 26/0006 |
| JP | 2023159060 | A * | 10/2023 | B23K 26/032 |
| JP | 7587591 | B2 * | 11/2024 | C30B 23/005 |
| JP | 7605915 | B2 * | 12/2024 | B23K 26/0006 |
| JP | 2025038050 | A * | 3/2025 | B23K 26/032 |
| WO | WO-2005093795 | A1 * | 10/2005 | C30B 19/12 |
| WO | WO-2005095679 | A2 * | 10/2005 | C30B 25/02 |
| WO | WO-2017053883 | A1 * | 3/2017 | C30B 23/02 |
| WO | WO-2018183585 | A1 * | 10/2018 | C01B 32/963 |
| WO | WO-2020136624 | A2 * | 7/2020 | B23K 6/032 |
| WO | WO-2021133626 | A1 * | 7/2021 | C30B 23/02 |
| WO | WO-2021240782 | A1 * | 12/2021 | H01L 29/0878 |
| WO | WO-2024073688 | A2 * | 4/2024 | H01L 21/0495 |
| WO | WO-2024163583 | A1 * | 8/2024 | H01L 29/045 |
| WO | WO-2024167627 | A1 * | 8/2024 | H01L 21/78 |

OTHER PUBLICATIONS

Gie, "HGL Series Wafer Laser Stealth Cutting Equipment", Henan General Intelligent Equipment Co., Ltd., https://www.chngie.com/copy_HGL.html, retrieved on Sep. 10, 2024 with machine translation, 6 pages.

Geng et al., "Slicing of 4H—SiC Wafers Combining Ultrafast Laser Irradiation and Bandgap-Selective Photo-Electrochemical Exfoliation", Advanced Materials Interfaces, vol. 10, No. 2300200, 2023, pp. 1-7.

Kim et al., "4H—SiC Wafer Slicing by Using Femtosecond Laser Double-Pulses", Optical Materials Express, vol. 7, No. 7, Jul. 1, 2017, pp. 2450-2460.

Zhang et al., "A Review of Femtosecond Laser Processing of Silicon Carbide", MDPI Micromachines, vol. 15, No. 639, May 10, 2024, pp. 1-26.

Aminoroaya et al., "A Review of Dental Composites: Challenges, Chemistry Aspects, Filler Influences, and Future Insights", Composites Part B: Engineering, vol. 216, No. 108852, 2021, pp. 1-23.

Chen et al., "Effect of Laser Incidence Angle on the Femtosecond Laser Ablation Characteristics of Silicon Carbide Ceramics", Optics and Lasers in Engineering, vol. 172, No. 107849, 2024, pp. 1-18.

Cho et al., "Dental Resin Composites: A Review on Materials to Product Realizations", Composites Part B: Engineering, vol. 230, No. 109495, 2022, 65 pages.

Kinashi et al., "UV-Assisted Deposition of TEOS SiO2 Films Using the Spin-Coating Method", Applied Surface Science, vol. 79-80, 1994, pp. 332-337.

Li et al., "Surface Micromorphology and Nanostructures Evolution in Hybrid Laser Processes of Slicing and Polishing Single Crystal 4H—SiC", Journal of Materials Science & Technology, vol. 184, 2024, pp. 235-244.

Moszner et al., "New Developments of Polymeric Dental Composites", Progress in Polymer Science, vol. 26, Issue 4, 2001, pp. 535-576.

Theissmann et al., "High Performance Low Temperature Solution-Processed Zinc Oxide Thin Film Transistor", Thin Solid Films, vol. 519, Issue 16, 2011, pp. 5623-5628.

* cited by examiner

OFF AXIS LASER-BASED SURFACE PROCESSING OPERATIONS FOR SEMICONDUCTOR WAFERS

FIELD

The present disclosure relates generally to semiconductor workpieces and semiconductor device fabrication, and more particularly to surface processing of semiconductor workpieces, such as silicon carbide semiconductor wafers.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or group III-nitride based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

One example aspect of the present disclosure is directed to a method. The method includes providing a semiconductor workpiece having a surface. The method includes providing emission of one or more lasers to the surface of a semiconductor workpiece at a non-perpendicular incidence angle relative to the surface. The method includes imparting relative motion between the one or more lasers and the semiconductor workpiece while providing emission of the one or more lasers to the surface of the semiconductor workpiece at the non-perpendicular incidence angle.

Another example aspect of the present disclosure is directed to a system. The system includes a laser source configured to emit a laser to remove material from a surface of a semiconductor workpiece at a non-perpendicular incidence angle relative to the surface of the semiconductor workpiece. The system includes at least one translation stage operable to impart relative motion between the surface of the semiconductor workpiece and the laser.

Another example aspect of the present disclosure is directed to a semiconductor workpiece. The semiconductor workpiece includes silicon carbide. The semiconductor workpiece includes a laser-defined surface. The laser-defined surface includes one or more off-axis laser-defined features.

Another example aspect of the present disclosure is directed to a semiconductor wafer. The semiconductor wafer includes an off-axis silicon carbide crystalline material, wherein a surface of the semiconductor workpiece comprises one or more step structures relative to a c-axis basal plane for the semiconductor workpiece. A surface of the semiconductor workpiece comprises a plurality of laser-defined features, the laser-defined features have a length extending in a direction that is generally perpendicular to the one or more step structures.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
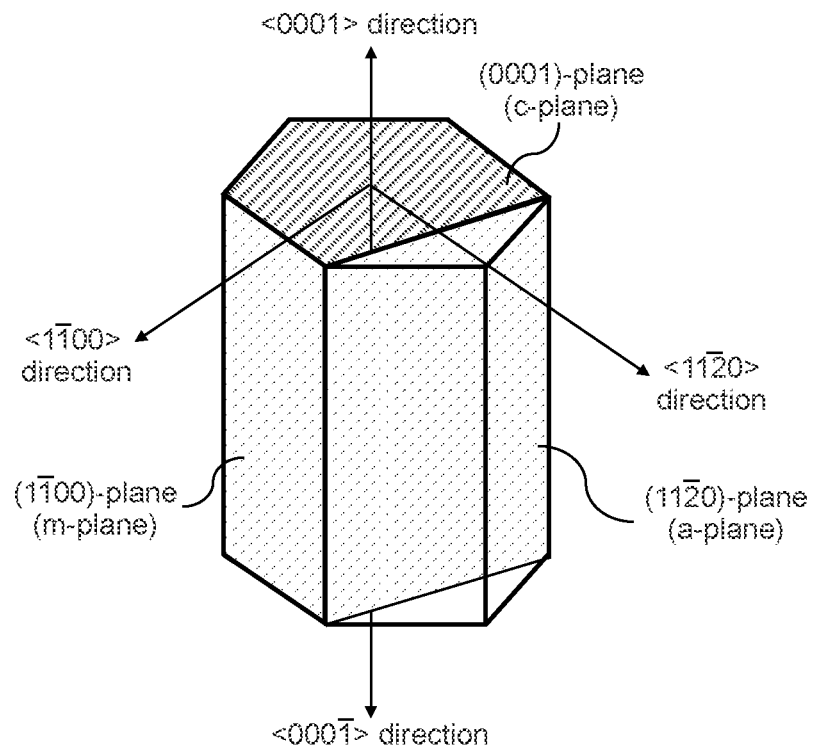
FIG. 1 is a first perspective view crystal plane diagram showing the coordinate system for a hexagonal crystal such as 4H-silicon carbide.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the technology according to example embodiments of the present disclosure may be used with any semiconductor material, such as other wide bandgap semiconductor materials, without deviating from the scope of the present disclosure. Example wide bandgap semiconductor materials include silicon carbide and the group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 millimeter, such as greater than about 5 millimeters, such as greater than about 10 millimeters, such as greater than about 20 millimeters, such as greater than about 50 millimeters, such as greater than about 100 millimeters, such as greater than about 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In some examples, a semiconductor wafer may have a thickness in a range of about 0.5 microns to about 1000 microns, or greater.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "side surface" corresponding to a surface extending between the two major surfaces. For example, the side surface may extend between the first major surface and the second major surface.

Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc. Example surface processing operations may include grinding operations, lapping operations, and polishing operations. Methods for surface processing of semiconductor wafers in semiconductor manufacturing may include grinding, lapping, and/or polishing the rough surfaces until a sufficient smoothness and/or thickness is achieved.

Grinding is a material removal process that is used to remove material from the semiconductor wafer. Grinding may be used to reduce a thickness of a semiconductor wafer. Grinding typically involves exposing the semiconductor wafer to an abrasive containing surface, such as grinding teeth on a grind wheel. Grinding may remove material of the semiconductor wafer through engagement with the abrasive surface.

Lapping is a precision finishing process that uses a loose abrasive in slurry form. The slurry typically includes coarser particles (e.g., largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a very smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a very smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving very low subsurface damage.

Aspects of the present disclosure refer to and/or claim a "surface roughness" of a surface. As used herein, unless otherwise specifically noted, the surface roughness is measured as "areal average roughness" Sa. When the present disclosure or claims refer to a surface having a surface roughness being within a range of values, a surface has a surface roughness in the range of values if any 1 millimeter by 1 millimeter area on the surface includes a surface roughness Sa within the specified range of values or if any 1 millimeter by 1 millimeter area on the surface includes a surface roughness Sz (maximum height) within the specified range of values.

As an example, a surface has a surface roughness in a range of 0.5 nm to 180 nm if any 1 millimeter×1 millimeter area on the surface has a surface roughness Sa in the range of 0.5 nanometers to 180 nanometers or if any 1 millimeter×1 millimeter area on the surface has a surface roughness Sz in the range of 0.5 nanometers to 180 nanometers. For the sake of clarity, it is not required that the entire surface have the surface roughness in the specified range of values. Only a single 1 millimeter×1 millimeter area on the surface is required to have a surface roughness in the specified range of values (e.g., either Sa or Sz) for the surface to be considered to have a surface roughness in the specified range of values.

Methods for fabricating semiconductor wafers from semiconductor material boules may incur significant material losses and consumable tool losses and costs due to the structural properties of crystalline boules and current methods of separating or fracturing substrates from a boule. Methods for fabricating power semiconductor devices include forming a crystalline material boule, such as a silicon carbide boule, and separating portions of the boule to form substrates, such as silicon carbide semiconductor wafers. In some instances, boules may be formed to include doped regions with dopants within the crystalline material boule.

Methods for forming semiconductor wafers from boules may include, for instance, cutting thin layers (e.g., wafers) from the boule using wire saws. Another example removal process for forming semiconductor wafers from boules may include a laser-based removal process. Laser-based removal processes may include providing subsurface laser damage patterns to a boule to form weakened areas in the boule. Portions may then be separated from the boule along the weakened areas to produce semiconductor wafers. Separation processes may include, for example, ultrasonic fracturing, mechanical force fracturing, or other fracturing methods.

The separating (e.g., fracturing and/or sawing) process may produce a rough and uneven surface on both the boule and the crystalline material substrates (e.g., semiconductor wafers) separated from the boule. Semiconductor devices and device manufacturing may require smooth surfaces on a semiconductor workpiece. Accordingly, in some cases, before continuing with further separations of the boule or further manufacturing with the semiconductor workpiece, the rough surface(s) may need to be subjected to surface processing operations. For instance, in some examples, the surface of the boule may be smoothed to allow for the formation of subsequent laser damage regions in the boule. Otherwise, a rough surface on the boule may lead to undesirable reflection/refraction of one or more laser(s) used during formation of the subsurface laser damage regions for removal of subsequent semiconductor wafers. Methods for surface processing of boules and substrates (e.g., semiconductor wafers) in semiconductor manufacturing may include grinding, lapping, and/or polishing the rough surfaces until a sufficient smoothness is achieved.

Some surface processing operations (e.g., grinding, lapping, polishing, etc.) may include planarizing rough or deeply grooved silicon carbide surfaces. Planar surface processing operations may expose a surface of the semiconductor wafer to a generally planar tool surface (e.g., grinding wheel, grind disc, polishing pad) for removing and/or smoothing material. The planar tool surface may remove material from "peaks" in the rough surface before removing material from deep trenches, valleys, or grooves in the rough surface. In this way, a planar surface processing operation may remove material from the semiconductor wafer and reduce surface roughness. Example planar surface processing operations include using a polishing pad, grind disc, or grind wheel.

Non-planar surface processing operations do not use a planar tool surface. For instance, non-planar surface processing operations may remove material from peaks and from valleys in the surface indiscriminately (e.g., at a nearly uniform rate). As a result, non-planar surface processing operations may replicate the surface topography of a semiconductor workpiece as material is removed from the semiconductor workpiece instead of smoothing the surface topography of the semiconductor workpiece. Non-planar surface processing operations may effectively remove material from the semiconductor wafer but may be unable to effectively reduce surface roughness. Example non-planar surface processing operations may include, for instance, laser-based surface processing operations, such as laser ablation on a surface of the semiconductor wafer. Other non-planar surface processing operations may include, for instance, electrochemical operations, reactive ion etching (RIE) based surface processing operations, plasma-based surface processing operations, sputtering-based surface processing operations, and/or a wet etch-based surface processing operations.

Grinding methods may incur substantial time, material, and consumable tool loss and cost due to the structural properties of the crystalline materials used in semiconductor devices and smoothness requirements of semiconductor devices. Materials used in wide bandgap semiconductor devices, such as, for example, silicon carbide, have extreme rigidity and strength requiring expensive tools (e.g., with diamond abrasive elements) that are rapidly consumed. The grinding process also results in material losses from grinding away potentially usable material to provide a sufficiently smooth surface for semiconductor device manufacturing.

Laser-based surface processing operations may provide reduced consumable tool loss and reduced cost compared to grinding methods. However, as indicated above, laser-based surface processing operations, in some examples, may be non-planar surface processing operations. Most notably, non-planar laser-based surface processing operations emitting a laser in a generally perpendicular direction relative to the surface of the semiconductor workpiece may ablate or remove materials from peaks and valleys of a surface of a workpiece indiscriminately. Rather than creating a uniform smooth surface on the workpiece, a non-planar laser ablation method may recreate the rough surface at a reduced height (e.g., reduced thickness) of the workpiece.

Accordingly, aspects of the present disclosure are directed to using a laser-based system with one or more lasers at a non-perpendicular incidence angle (referred to as an "off-axis" angle), for surface processing of surfaces of semiconductor workpieces. For instance, aspects of the present disclosure are directed to a method for manufacturing a semiconductor wafer including providing a semiconductor workpiece and ablating a surface of the semiconductor workpiece using one or more lasers at a non-perpendicular incidence angle (e.g., about 750 or less, about 450 or less, about 300 or less, about 15° or less, etc.) relative to the surface. The one or more lasers may ablate the surface to reduce surface roughness (e.g., characterized by peaks and valleys across the surface) and/or, in some examples, reduce a thickness of the semiconductor wafer. (e.g., reduce a thickness of the semiconductor wafer by at least 25 microns).

In some examples, an exposed surface of the boule may be ablated with one or more off-axis lasers to smooth the exposed surface of the boule prior to implementing another removal process to separate another semiconductor wafer from the boule. This may reduce interference (e.g., undesirable reflection, refraction, etc.) caused by a roughened surface of the boule with the subsequent laser(s) used, for instance, during a subsequent laser-based removal process.

In some examples, an off-axis laser ablation process may be performed with one or more lasers having specific laser parameters sufficient to remove material (e.g., silicon carbide). The laser parameters may include, for instance, laser power, laser wavelength, laser pulse duration, focusing depth, translation speed, laser incidence angle, and the like. In some examples, a laser performing an off-axis laser ablation process may be operated in accordance with the following laser parameters:

Laser wavelength: about 190 nanometers to about 1100 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers, such as about 532 nanometers, such as about 1064 nanometers, such as about 1080 nanometers; or multiple wavelengths (e.g., white light) including any of the foregoing;

Laser pulse frequency: about 1 kilohertz to about 200 kilohertz, such as about 10 kilohertz to about 150 kilohertz, such as about 20 kilohertz to about 100 kilohertz;

Laser power: 0.1 watts to about 500 watts, such as about 0.5 watts to about 100 watts, such as about 1 watt to about 40 W, such as about 1 watts to about 10 watts;

Laser pulse duration: about 0.1 femtoseconds to about 300 nanoseconds; such as about 1 femtosecond to about 500 picoseconds, such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focal depth: about 0 microns to about 2000 microns (beneath the surface of the workpiece), such as about 0 microns to about 1000 microns (beneath the surface of the workpiece), such as about 1 micron to about 100 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joules, such as about 10 nanojoules to about 200 millijoules.

To perform the laser-based surface processing operation, relative motion may be imparted between the surface and the one or more lasers ablating the surface. It should be appreciated that both moving the one or more lasers (e.g., through a translation stage and/or one or more optical devices, such as lenses, mirrors, etc.) relative to the surface and moving the surface relative to the one or more lasers may fall within the scope of the present disclosure. During an off-axis laser-based surface processing operation according to examples of the present disclosure, the one or more lasers may, for example, scan at least 85% of the surface through relative motion between the one or more lasers and the surface, such as at least 95% of the surface, such as at least 99% of the surface.

However, in some examples, one or more lasers may scan less of the surface, such as less than about 50% of the surface. For instance, in examples involving patterning of the surface of a workpiece with areas of sub-surface damage for fiducial marking, dicing, etc., the one or more lasers may scan 50% or less of the surface.

The surface may be scanned by the one or more lasers in one or more passes. Each pass of the laser may have a scan dimension (e.g., spot size) representative of a dimension of the laser on the exposed surface. The scan dimension (e.g., spot size) may be in a range of, for instance, 10 microns to about 25 millimeters, such as about 500 microns to about 25 millimeters, such as about 1 millimeter to about 25 millimeters, such as about 1 millimeter to about 10 millimeters. In some examples, there may be a distance between passes of each laser. The distance between each scan may be, for instance, in a range of about 0 millimeters to about 1 millimeter, such as about 0 millimeters to about 500 microns. In some examples, there may be no distance between passes of each laser. In some examples there may be overlap between scans or passes of the laser on the surface. In some examples, there may be about 0% to about 50% overlap of the scan dimension between passes of each laser.

The lasers may scan the surface in any suitable pattern. Example laser scan patterns are provided in FIGS. 16-22 below.

In some embodiments, imparting relative motion may include imparting relative motion such that the one or more lasers scan the surface in a direction generally perpendicular to a direction associated with a length of one or more step structures on the surface of the semiconductor wafer. The step structures may be on the surface of the semiconductor wafer as a result of a removal process associated with removing an off-axis semiconductor wafer from an off-axis boule as will be described in more detail below.

In some examples, imparting relative motion between the one or more lasers and the surface may include adjusting the non-perpendicular incidence angle of the one or more lasers while imparting relative motion. Adjusting the non-perpendicular incidence angle may be based on a variety of parameters. For instance, the non-perpendicular incidence angle may be adjusted based on a number of scans of the one or more lasers, a surface roughness of the surface, and/or a removal depth of the semiconductor workpiece. Example non-perpendicular incidence angles may include, for instance, about 750 or less, such as about 45° or less, such as about 30° or less, such as about 15° or less.

In some examples, the off-axis laser ablation process may be performed on the surface at a fixed focal depth at or near the surface. about 0 microns to about 2000 microns (beneath the surface of the workpiece), such as about 0 microns to about 1000 microns (beneath the surface of the workpiece), such as about 1 micron to about 100 microns (beneath the surface of the workpiece), such as about 0 microns to about 5 microns (beneath the surface of the workpiece), such as about 0 microns to about 1 micron (beneath the surface of the workpiece). In some examples, the laser ablation process may be performed in multiple passes of the laser over the same position of the workpiece at the fixed focal depth to achieve desired material removal or thickness reduction in the surface. For instance, multiple passes of the laser at a fixed focal depth at about 1 micron below the peak height of the surface may be performed to achieve a desired reduction in thickness of about 25 microns or more.

In some examples, various laser parameters, including laser incidence angle, associated with the laser-based surface processing operations may be adjusted, changed or tuned depending on the materials and other parameters of the boule and/or the substrate. In some examples, to adjust the one or more laser parameters, data may be obtained regarding the exposed surface and/or the material of the workpiece before, during, and/or after the ablation process. The data may include, for instance, workpiece property data that provides data associated with a surface of the workpiece (e.g., topology, roughness), subsurface regions of the workpiece, optical properties of the workpiece, temperature of the workpiece, doping level of the workpiece, polytype of the workpiece (e.g., 4H, 6H), or other parameters. For instance, the workpiece property data may be obtained using one or more sensors. In some examples, the workpiece property data may include data associated with a surface topology of the workpiece. In some examples, the workpiece property data may include an image of the exposed surface obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topology, optical properties, etc.

In some examples, various laser parameters, including laser incidence angle, may be adjusted to support different laser-based surface processing operations, such as patterning of a workpiece, for instance, for fiducial marking, engraving, dicing, inducing subsurface laser damage, treatment, annealing, etc. For instance, as one example, one or more lasers may be provided onto the surface of the workpiece at a first incidence angle (e.g., generally perpendicular incidence angle) to provide a first type of feature (e.g., a rough trench feature) on the workpiece. The one or more lasers may be provided onto the surface of the workpiece at a second incidence angle (e.g. a non-perpendicular incidence angle) to provide a second type of feature (e.g., a smoother feature relative to the first type of feature) on the workpiece.

In some embodiments, the non-perpendicular incidence angle may be specified as a function of position on the surface (e.g., the parameters are modified and changed based on position of the one or more lasers on the surface). The non-perpendicular incidence angle may be adjusted and/or selected as a function of position on the surface. For instance, the non-perpendicular incidence angle at a first position with a large surface roughness may be different from the non-perpendicular incidence angle at a second position with a smaller surface roughness. In some examples, the non-perpendicular incidence angle at a first position with a high surface topology (e.g., peak) may be closer to 0° (e.g., closer to parallel with the surface of the workpiece) relative to a second position with a deep surface topology (e.g., valley).

Aspects of the present disclosure are additionally directed to systems for implementing the methods discussed herein. For instance, aspects of the present disclosure relate to a laser processing system for processing a surface of a semiconductor workpiece. The laser processing system includes one or more laser sources operable to emit laser(s) at a non-perpendicular incidence angle relative to the surface of the semiconductor workpiece. The system may include at least one translation stage that may impart relative motion between the one or more lasers and the semiconductor workpiece. In some embodiments, the translation stage may move the lasers and/or the workpiece relative to one another. In some embodiments, the translation stage includes one or more optics (e.g., mirrors) along one or more axes configured to move or scan the laser relative to the semiconductor workpiece. Additionally, or alternatively, the one or more optics may be configured to adjust the non-perpendicular incidence angle of the one or more lasers.

Additionally, in some examples, the system may include at least one sensor and a controller. The sensor(s) may be operable to obtain data associated with one or more workpiece properties. For instance, the sensor may be an optical sensor, image capture device, or one or more surface measurement lasers. The sensor(s) may be used to determine, for instance, a surface topology or other workpiece property data of the workpiece. The controller may receive data from at least one sensor and determine one or more laser parameters based on the workpiece property data. The controller may control the laser to remove the exposed surface based, at least in part, on the laser parameters. For instance, the controller may adjust a non-perpendicular incidence angle of the one or more lasers based on data from at least one sensor.

In some examples, the system may include two or more laser sources operable to emit two or more different lasers. Each laser may be configured to operate in accordance with different laser parameters (e.g., different incidence angles). For instance, in some embodiments, a first laser source may emit a first laser at a first incidence angle (e.g., perpendicular or non-perpendicular incidence angle). A second laser source may emit a second laser at a second incidence angle (e.g., perpendicular or non-perpendicular incidence angle) that is different from the first incidence angle.

In addition, and/or in the alternative, the system may include one or more laser sources operable to emit a laser to implement a laser-based removal process to remove a substrate from a boule. The system may include one or more different laser sources (e.g., operating with different laser parameters) to implement the laser-based surface processing operations (e.g., laser ablation) at a non-perpendicular incidence angle on a semiconductor workpiece according to example embodiments of the present disclosure. In some examples, the system may include one or more laser sources operable to scribe a fiducial workpiece mark or ID mark on the workpiece. In some examples, the system may include one or more laser sources configured to singulate or cut a plurality of semiconductor die from the workpiece. In some examples, the system may include one or more laser sources configured to provide a laser-based processing operation on a workpiece edge (e.g., wafer edge).

Aspects of the present disclosure are further directed to a semiconductor workpiece (e.g., semiconductor wafer). The semiconductor workpiece may include silicon carbide (e.g., 4H silicon carbide, 6H silicon carbide, etc.). A surface of the semiconductor wafer may include one or more step structures relative to a c-axis basal plane for the semiconductor workpiece. The surface of the semiconductor workpiece may have a plurality of off-axis laser-defined features of removed material. The off-axis laser defined features may include one or more strips of removed material (e.g., ablated strips). In some examples, the off-axis laser defined feature may include pulsed strips having asymmetric pulse spots along the strip associated with a laser pulse removing material from the surface. The asymmetric pulse spot may be asymmetrical, indicating that the pulse spot results from an off-axis laser incident on the surface of the workpiece at a non-perpendicular incidence angle.

The off-axis laser-defined features (e.g., ablated strips) may have a length extending in a direction that is generally perpendicular to the one or more step structures. For instance, the laser-defined features may be arranged in a regular pattern. The regular pattern may correspond to the scanning path of the laser during a laser ablation process.

In some examples, each laser-defined feature may have a width corresponding generally to a scan dimension associated with the laser during the laser scan, such as a width in a range of about 10 microns to about 25 millimeters. In some examples, there may be a distance between laser-defined features (e.g., strips) in the laser-defined surface. The distance between each scan may be, for instance, in a range of about 0 millimeters to about 1 millimeter, such as about 0 millimeters to about 500 microns. In some examples, there may be no distance between laser-defined features (e.g., strips) in the laser-defined surface. In some examples there may be overlap between laser-defined features (e.g., strips) on the laser-defined surface. The laser-defined surface may include a surface roughness in a range of about 20 nanometers to about 65 microns. In some instances, the surface roughness may be in a range of about 0.5 nanometer to about 180 nanometers, such as about 0.5 nanometer to about 125 nanometers, such as about 1 nanometer and about 100 nanometers, such as about 2 nanometers and about 50 nanometers. In some examples, the semiconductor workpiece may have a diameter in a range of about 100 millimeters to about 300 millimeters, such as about 100 millimeters, such as about 150 millimeters, such as about 200 millimeters.

Aspects of the present disclosure provide a number of technical effects and benefits. For instance, aspects of the present disclosure allow for increasing the laser energy at higher surface features (e.g., peaks, ridges) of a workpiece surface versus lower features (e.g., valleys, trenches, pits) thereby removing predominantly higher surface features prior to removing lower features, thereby planarizing the surface. Removing the higher surface features may reduce the surface roughness of a workpiece. Additionally, aspects of the present disclosure allow for surface processing of semiconductor material surfaces without the use of consumable tools through non-surface contacting technologies. More specifically, aspects of the present disclosure allow for surface processing of semiconductor material surfaces using one or more lasers that are not consumed and therefore considerably reduce the manufacturing cost and time of semiconductor devices with high material strength and rigidity, such as silicon carbide.

In some instances, operation costs of non-consumable surface processing operations do not grow in tandem with operational growth. Rather, operation costs may remain linear or stagnant due to lack of deterioration from non-surface contacting technologies. As another example, the use of non-surface contacting technologies for smoothing semiconductor material surfaces reduces the material lost due to manufacturing defects brought on during traditional surface smoothing practices. For instance, surface processing operations that use grinding may damage otherwise healthy portions of boules or semiconductor wafers and may create a loss of the boule or semiconductor wafer entirely or otherwise may result in additional material lost to the surface processing operation to correct the damage.

In some examples, implementation of a laser-based surface processing operation according to example embodiments of the present disclosure may increase fracture strength of a silicon carbide wafer. Fracture strength provides a measure of a force a semiconductor workpiece may withstand before fracturing. As used herein, fracture strength is the magnitude of the minimum force needed to fracture a semiconductor workpiece when the force is applied to a first surface of the semiconductor workpiece along a middle axis located centrally between two support structures supporting the semiconductor workpiece from a second surface of the semiconductor workpiece, where the support structures are spaced apart by a gap of 4 inches.

In some examples, the fracture strength of a semiconductor wafer removed from a boule may be increased by using a laser-based surface processing operation on the surface of the semiconductor wafer according to the examples disclosed here. For instance, a silicon carbide semiconductor wafer with about a 150 mm diameter and a thickness of about 350 microns that has been separated from a boule may exhibit a fracture strength in a range of about 10 N to about 20 N. However, after undergoing a laser-based surface processing operation according to examples of the present disclosure, the fracture strength of the silicon carbide semiconductor wafer may increase to about 100 N or greater, such as in a range of about 100 N to about 150 N.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 is a first perspective view crystal plane diagram showing the coordinate system for a hexagonal crystal such as 4H-silicon carbide ("SiC"), in which the c-plane (0001) is perpendicular to both the m-plane (1$\bar{1}$00) and the a-plane (11$\bar{2}$0). The c-plane is perpendicular to the <0001> direction. The m-plane (1$\bar{1}$00) is perpendicular to the <1$\bar{1}$00> direction. The a-plane (11$\bar{2}$0) is perpendicular to the <11$\bar{2}$0> direction. The <000$\bar{1}$> direction is opposite the <0001> direction.

Figure 2:
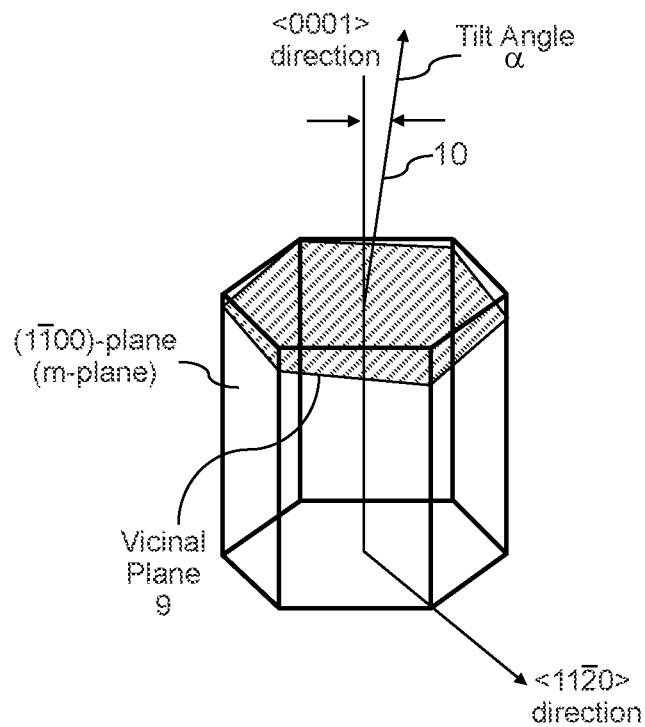
FIG. 2 is a second perspective view crystal plane diagram for a hexagonal crystal, illustrating a vicinal plane that is non-parallel to the c-plane.

FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the <11$\bar{2}$0> direction.

Figure 3A:
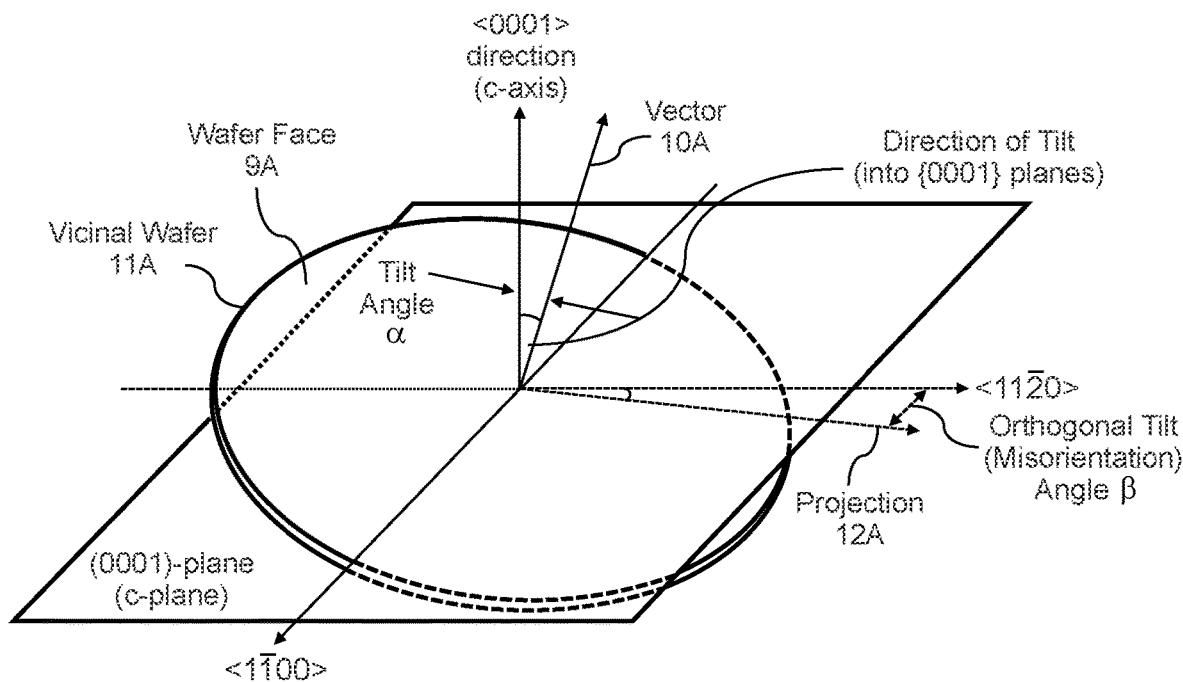
FIG. 3A is a perspective view wafer orientation diagram showing orientation of a vicinal wafer relative to the c-plane.

FIG. 3A is a perspective view of a wafer orientation diagram showing orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) β may span between the <11$\bar{2}$0> direction and the projection of vector 10A onto the c-plane.

Figure 3B:
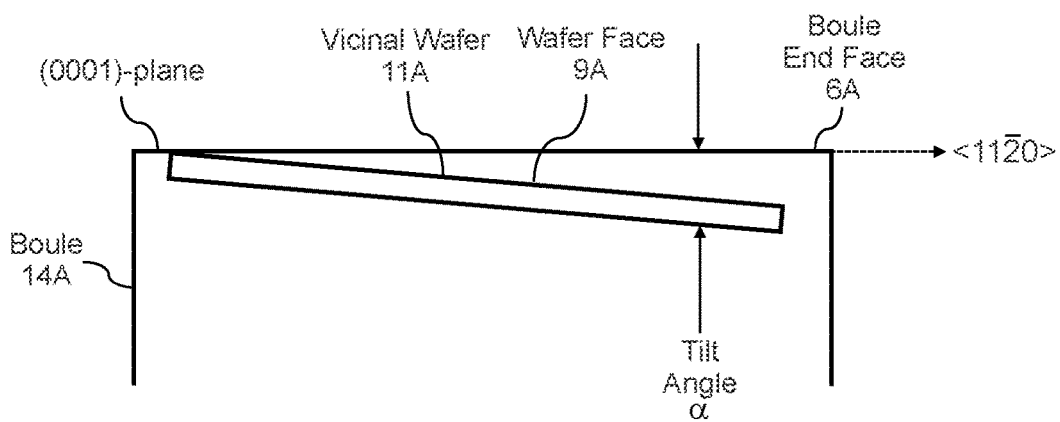
FIG. 3B is a simplified cross-sectional view of the vicinal wafer of FIG. 4A superimposed over a portion of a boule.
Figure 3C:
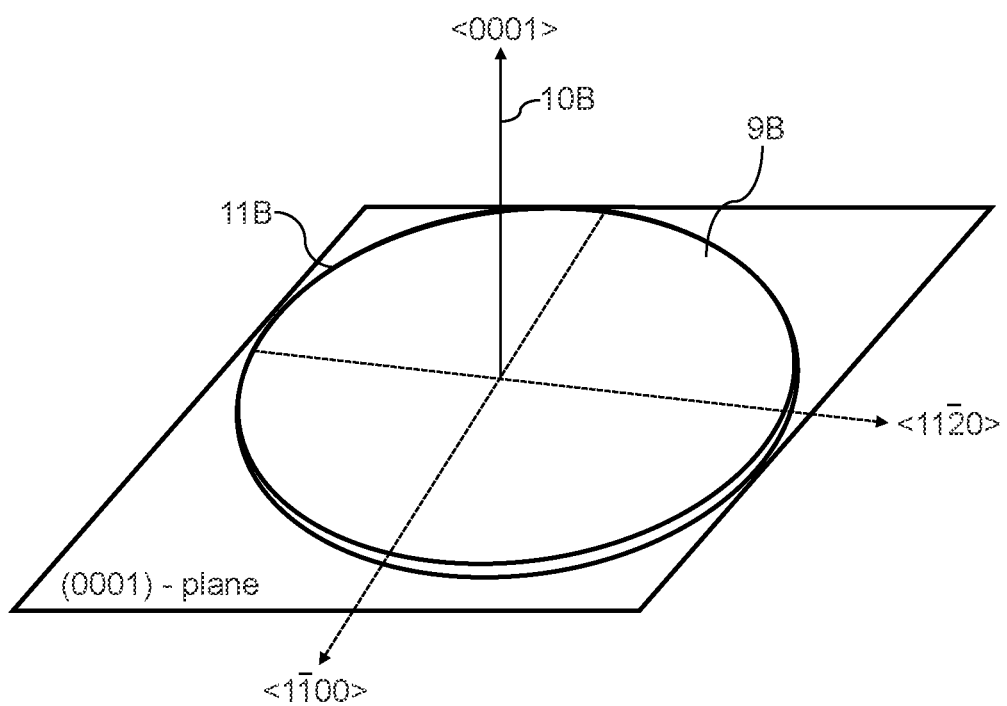
FIG. 3C is a perspective view of a wafer orientation diagram showing orientation of an on-axis wafer relative to the c-plane.
Figure 3D:
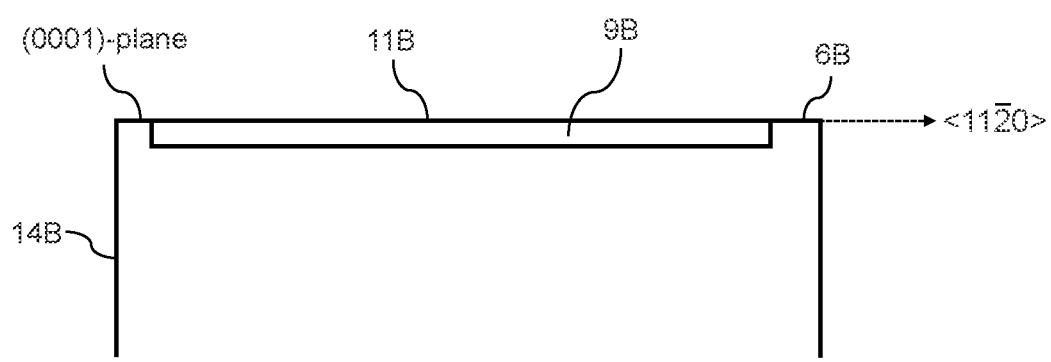
FIG. 3D is simplified cross-sectional view of the wafer of FIG. 3C superimposed over a portion of a boule.

FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α.

Figure 4:
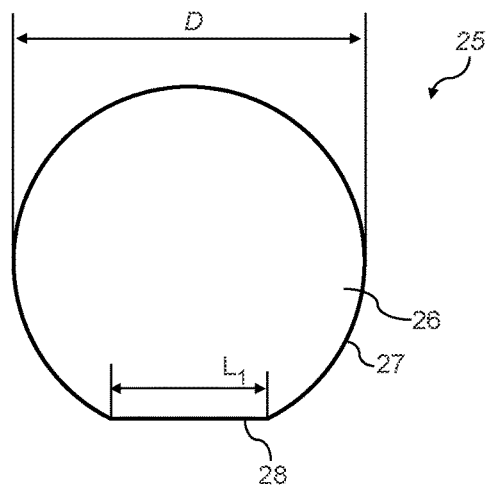
FIG. 4 is a top plan view of an example silicon carbide wafer, with superimposed arrows showing crystallographic orientation directions.

FIG. 4 is a top plan view of an example silicon carbide semiconductor wafer 25 including an upper face 26. The silicon carbide semiconductor wafer 25 may include a surface that is misaligned with (e.g., off-axis at an oblique angle relative to) the c-plane. The silicon carbide semiconductor wafer 25 may be laterally bounded by a generally round edge 27 (having a diameter D) including a primary flat 28 (having a length $L_1$) that is perpendicular, for instance, to the $(11\bar{2}0)$ plane. In some instances, the wafer 25 may include a notch instead of a flat.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having hexagonal crystal structure, such as 4H-SiC, 6H-SiC, or Group III nitride materials (e.g., GaN, AlN, InN, InGaN, AlGaN, or AlInGaN). Various illustrative embodiments described hereinafter mention SiC generally or 4H-SiC specifically, but it is to be appreciated that any suitable crystalline material may be used. Among the various SiC polytypes, the 4H-SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 5A:
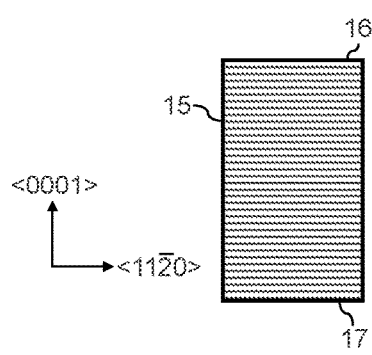
FIG. 5A is a side elevation schematic view of an on-axis boule of crystalline material.
Figure 5B:
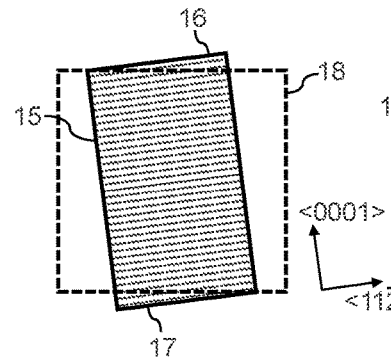
FIG. 5B is a side elevation schematic view of the boule of FIG. 5A being rotated by 4 degrees, with a superimposed pattern for cutting end portions of the boule.
Figure 5C:
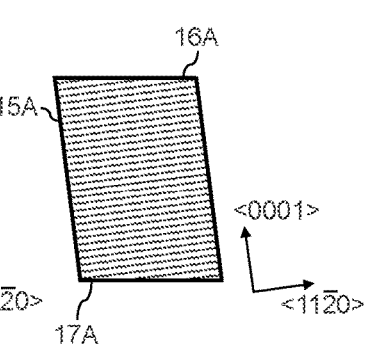
FIG. 5C is a side elevation schematic view of a boule following removal of end portions to provide end faces that are non-perpendicular to the c-direction.
Figure 5D:
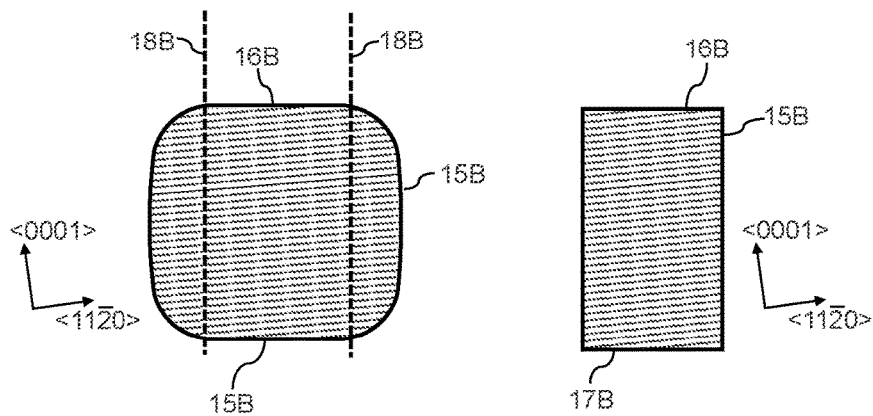
FIG. 5D is a side elevation schematic view of an off-axis grown boule of crystalline material.
Figure 5E:
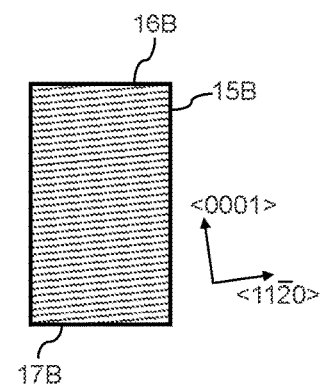
FIG. 5E is a side elevation schematic view of an off-axis grown boule having end faces that are non-perpendicular to the c-direction.

FIGS. 5A and 5C schematically illustrate on-axis and off-axis crystalline substrates in the form of boules that may be utilized with methods disclosed herein. FIG. 5A is a side elevation schematic view of an on-axis boule 15 of crystalline material having first and second end faces 16, 17 that are perpendicular to the c-direction (i.e., <0001> direction for a hexagonal crystal structure material such as 4H-SiC). FIG. 5B is a side elevation schematic view of the boule 15 of FIG. 5A being rotated by four degrees, with a superimposed pattern 18 (shown in dashed lines) for cutting and removing end portions of the boule 15 proximate to the end faces 16, 17. FIG. 5C is a side elevation schematic view of an off-axis boule 15A formed from the boule 15 of FIG. 5B, following removal of end portions to provide new end faces 16A, 17A that are non-perpendicular to the c-direction. Aspects of the present disclosure are applicable both on-axis boules 15 and/or off-axis boules 15A or other on-axis crystalline materials and/or off-axis crystalline materials.

Figure 6:
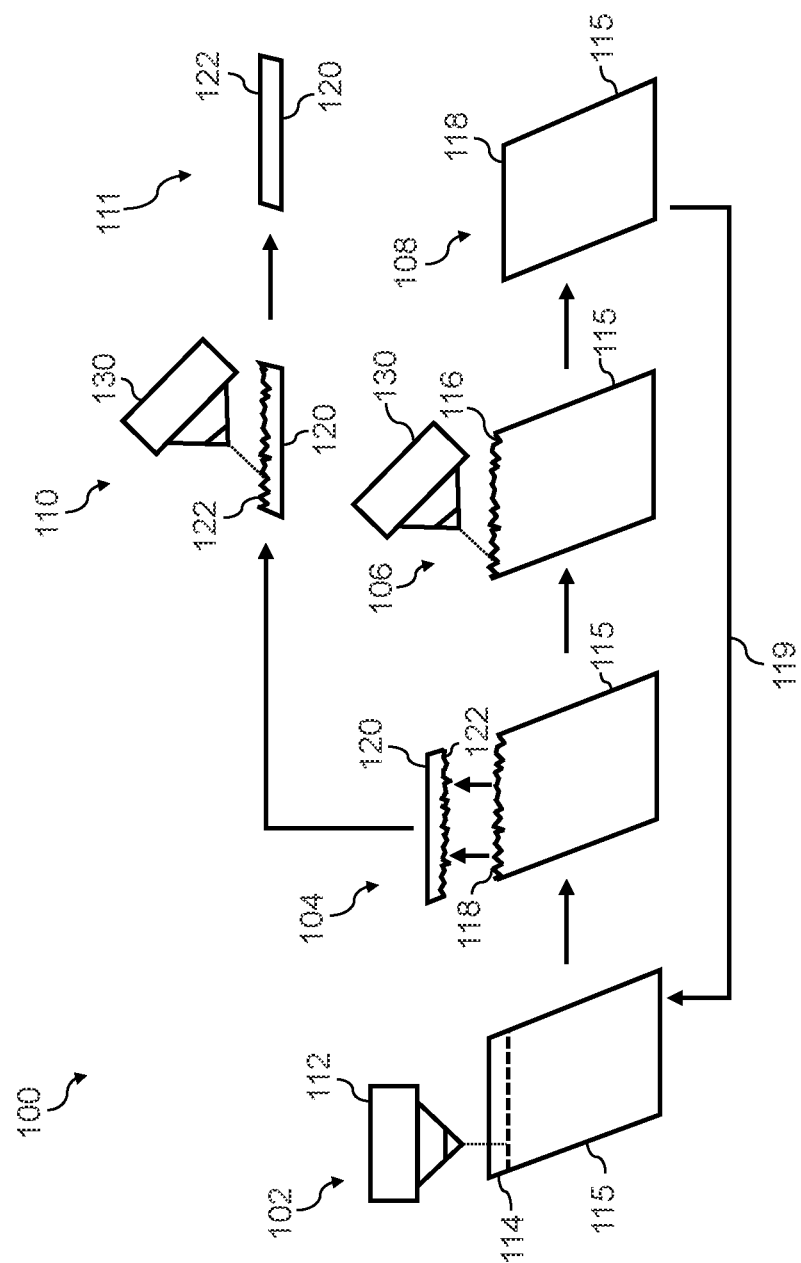
FIG. 6 depicts an overview of an example method according to examples of the present disclosure.

FIG. 6 depicts an overview of an example method 100 according to example embodiments of the present disclosure. FIG. 6 is intended to represent structures for identification and description and is not intended to represent the structures to physical scale. The method 100 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 102, the method 100 may include performing a removal process on a boule 115. The removal process may be a laser-based removal process or other removal process (e.g., wire saw-based removal process). For instance, in some examples, one or more laser source(s) 112 may be operated (e.g., at a perpendicular incidence angle or a non-perpendicular incidence angle) to induce a subsurface laser damage region 114 in the boule 115. The boule 115 may be similar to the boule 15 or the off-axis boule 15A of FIGS. 5A and 5C respectively.

In some examples, the laser source 112 may be operated in accordance with certain laser parameters to induce the subsurface laser damage region 114 in the boule 115. For instance, in certain examples, a laser having a wavelength of in a range about 800 nanometers to about 1100 nanometers may be used to implement the laser-based removal process. Although a wide range of pulse frequencies may be used in certain embodiments, pulse frequencies of 120 kilohertz to 150 kilohertz may be employed in the laser-based removal process. A translation speed in a range of about 500 millimeters per second to about 3000 millimeters per second between a laser source 112 and a boule 115 may be used. However, higher or lower translation stage speeds may be used in certain embodiments with suitable adjustment of laser frequency to maintain desirable laser pulse overlap. Average laser power ranges for forming subsurface laser damage 114 may be in a range of from about 0.5 watts to about 10 watts for silicon carbide. Laser pulse energy may be calculated as power divided by frequency. Laser pulse widths of about 1 nanosecond to about 10 nanoseconds may be used, although other pulse widths may be used in other embodiments.

Referring to FIG. 6 at 104, the method 100 may include separating a semiconductor wafer 120 from the boule 115 along the subsurface laser damage region 114. Removing the wafer 120 from the boule 115 may be performed through a variety of methods. For instance, a mechanical fracturing process, ultrasonic fracturing process, or other fracturing process may be used to fracture and separate the semiconductor wafer 120 from the boule 115.

In some examples, separating the semiconductor wafer 120 from the boule 115 may leave rough exposed surfaces on both the semiconductor wafer 120 and the boule 115. For instance, the semiconductor wafer 120 may have an exposed surface 122 with high surface roughness, such as a surface roughness greater than about 65 microns. Similarly, the boule 115 may have an exposed surface 118 with high surface roughness, such as a surface roughness greater than about 65 microns.

Aspects of the present disclosure are directed to using an off-axis laser-based surface processing operation to remove portions of the exposed surface and/or to provide a smoother surface suitable for later fabrication operations. As an example, as shown at 106, the method 100 may include ablating the exposed surface 118 of the boule 115 using one or more off-axis lasers (e.g., at a non-perpendicular incidence angle) of a laser system 130 to remove material from the exposed surface 118. The laser ablation process(s) may result in a smoother exposed surface 118 of the boule 115 as shown at 108.

By processing the exposed surface 118 of the boule 115 with the laser system 130 as shown at 106, the boule 115 may be suitable to be reused for subsequent removal processes as indicated by arrow 119 (e.g., subsequent laser-based removal processes). In some examples, More particularly the boule 115 may be smoothed for a subsequent laser fracturing operation or to reduce the effort or total material removal requirement of subsequent surface smoothing operations. For instance, a rough surface on the boule 115 may lead to undesirable reflection/refraction of one or more laser(s) used during formation of the subsurface laser damage regions for removal of subsequent semiconductor wafers. In some examples, additional surface processing operations may occur on the boule 115 prior to subsequent removal processes (e.g., grinding, polishing, lapping, etc.).

As another example, as shown at 110, the method 100 may include ablating the exposed surface 122 of the semiconductor wafer 120 using one or more off-axis lasers of a laser system 130 to remove material from the exposed surface 122. The laser-based surface processing operation may result in a smoother exposed surface 122 of the semiconductor wafer 120 as shown at 111. Accordingly, the semiconductor wafer 120 may be suitable for subsequent semiconductor device fabrication operations.

Figure 7:
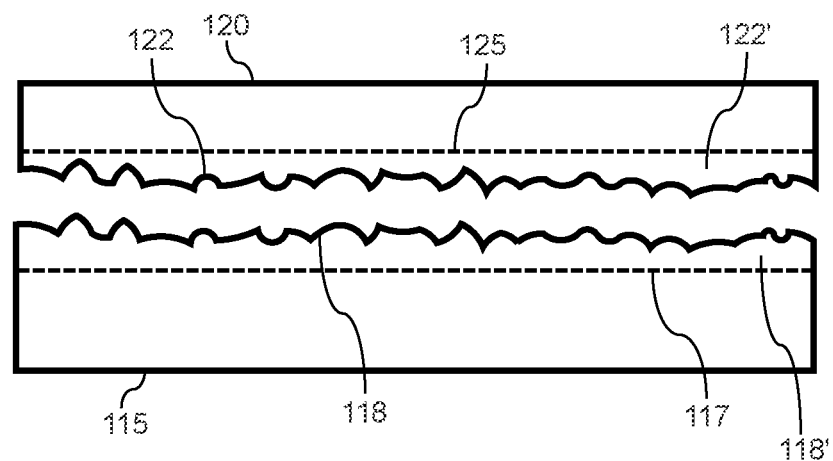
FIG. 7 depicts a cross-sectional representation of a boule that has been subjected to a removal process according to examples of the present disclosure.

FIG. 7 depicts a cross-sectional representation of the boule 115 after undergoing a removal process according to example aspects of the present disclosure. As shown, the semiconductor wafer 120 has been separated from the boule 115 leaving a rough exposed surface 118 on the boule 115 and a rough exposed surface 122 on the semiconductor wafer 120. The boule 115 may include a removal portion 118' that may be removed using laser ablation process(s) up to removal point 117 to provide a smoother surface on the portion of the boule 115. Similarly, the semiconductor wafer 120 may include a removal portion 122' that may be removed using laser ablation process(s) up to removal point 125 to provide a smoother surface on the portion of the semiconductor wafer 120.

Figure 8:
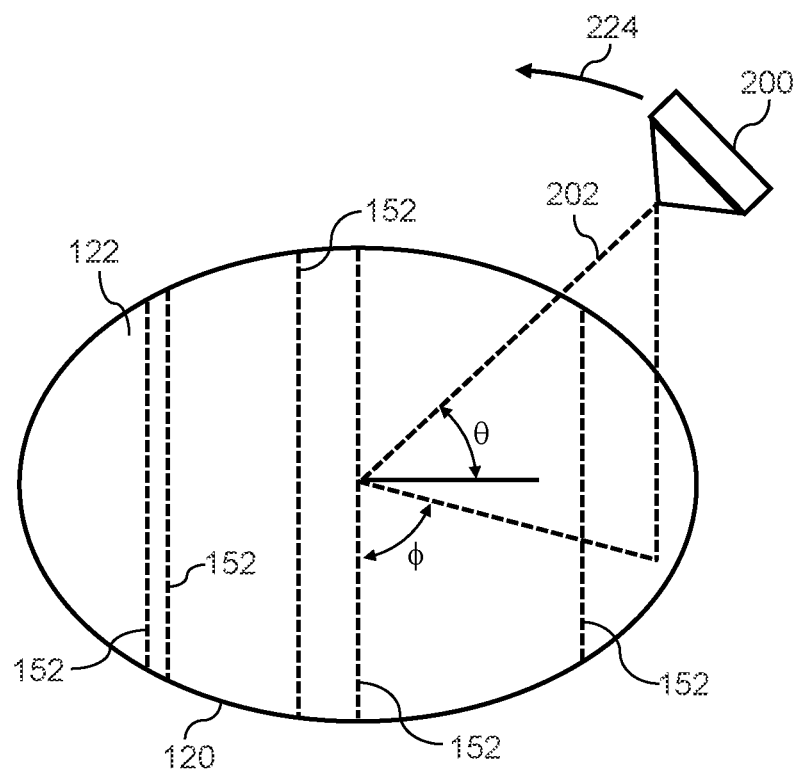
FIG. 8 depicts emission of one or more lasers at a non-perpendicular incidence angle relative to a semiconductor workpiece according to examples of the present disclosure.

FIG. 8 depicts providing emission of a laser 202 at a non-perpendicular incidence angle relative to the surface 122 of the semiconductor wafer 120. As used herein, providing emission of a laser refers to both providing continuous emission and/or providing modulated emission (e.g., a plurality of laser pulses). FIG. 8 is discussed with reference to providing emission of a laser with respect to a surface 122 of the semiconductor wafer 120 for purposes of illustration and discussion. However, the laser 202 may be provided across the surface of any semiconductor workpiece, such as the rough exposed surface 118 of the boule 115 in FIG. 6 and FIG. 7B.

As shown in FIG. 8, the laser source 200 may be configured (e.g., through one or more optics such as mirrors, lens, etc.) to provide emission of one or more lasers 202 at a non-perpendicular incidence angle $\theta$, such as at an incidence angle $\theta$ of less than about 75°, such as less than about 45°, such as less than about 30°, such as less than about 15°. Providing the emission of the laser 202 at a non-perpendicular incidence angle $\theta$ may help with removal of peaks in the surface 122 prior to the modification of deep topological areas in the surface 122, facilitating reduction of surface roughness and planarization of the surface 122 using laser-based surface processing operations (e.g., laser ablation) according to examples of the present disclosure.

In some embodiments, the incidence angle $\theta$ of the laser 202 relative to the surface 122 may be adjusted during the laser-based surface processing operation. For instance, during a first pass of the laser 202 at a fixed focal depth (e.g., about 1 micron below the peak height of the surface 122), the laser source 200 may be configured to provide emission of one or more lasers 202 at a first incidence angle $\theta$ (e.g., non-perpendicular incidence angle). During a second pass or subsequent pass of the laser 202 at a fixed focal depth (e.g., about 1 microns below the peak height of the surface 122), the laser source 200 may be configured to provide emission of one or more lasers 202 at a second incidence angle $\theta$ (e.g., non-perpendicular incidence angle, not pictured to change in FIG. 8). In some embodiments, the incidence angle $\theta$ of the laser 202 may be controlled as indicated by arrow 224 to be closer and closer to a perpendicular incidence angle with each subsequent pass of the laser 202 on the surface 122. In some embodiments, the incidence angle $\theta$ of the laser 202 may be adjusted based at least in part on data indicative of the surface roughness of the surface 122 (e.g., obtained from one or more sensors) and/or based on data indicative of a removal depth of the surface 122. In some embodiments, the incidence angle of the laser 202 may be adjusted based at least in part on a removal depth of the semiconductor wafer 120, or other semiconductor workpiece. In some embodiments, the incidence angle $\theta$ of the laser 202 may be oscillating in a regular or irregular manner.

In some examples, the laser source 200 may be operated in accordance with the following laser parameters:

Laser wavelength: about 190 nanometers to about 1100 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers, such as about 532 nanometers, such as about 1064 nanometers, such as about 1064 nanometers, such as about 1080 nanometers; or multiple wavelengths (e.g., white light) including any of the foregoing;

Laser pulse frequency: about 1 kilohertz to about 200 kilohertz, such as about 10 kilohertz to about 150 kilohertz, such as about 20 kilohertz to about 100 kilohertz;

Laser power: 0.1 watts to about 500 watts, such as about 0.5 watts to about 100 watts, such as about 1 watt to about 40 watts, such as about 1 watt to about 10 watts;

Laser pulse duration: about 0.1 femtoseconds to about 300 nanoseconds; such as about 1 femtosecond to about 500 picoseconds, such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joules, such as about 10 nanojoules to about 200 milliJoules.

The laser source 200 may provide emission (e.g., continuous emission and/or pulsed emission) of the laser at one or more non-perpendicular incidence angles across the surface 122 of the semiconductor wafer 120.

The surface 122 may be scanned by the laser 202 in one or more pass. Each pass of the laser 202 may have a scan dimension (e.g., spot size) representative of a dimension of the laser 202 on the surface 122. The scan dimension (e.g., spot size) may be in a range of, for instance, 10 microns to about 25 millimeters, such as about 500 microns to about 25 millimeters, such as about 1 millimeter to about 25 millimeters, such as about 1 millimeter to about 10 millimeters. In some examples, there may be a distance between passes of each laser 202. The distance between each scan or pass may be, for instance, in a range of about 0 millimeters to about 1 millimeter, such as about 0 millimeters to about 500 microns. In some examples, there may be no distance between passes of each laser. In some examples there may be overlap between scans or passes of the laser 202 on the surface 122. In some examples, there may be about 0% to about 50% overlap of the scan dimension (e.g. spot size) between passes of each laser.

Figure 22:
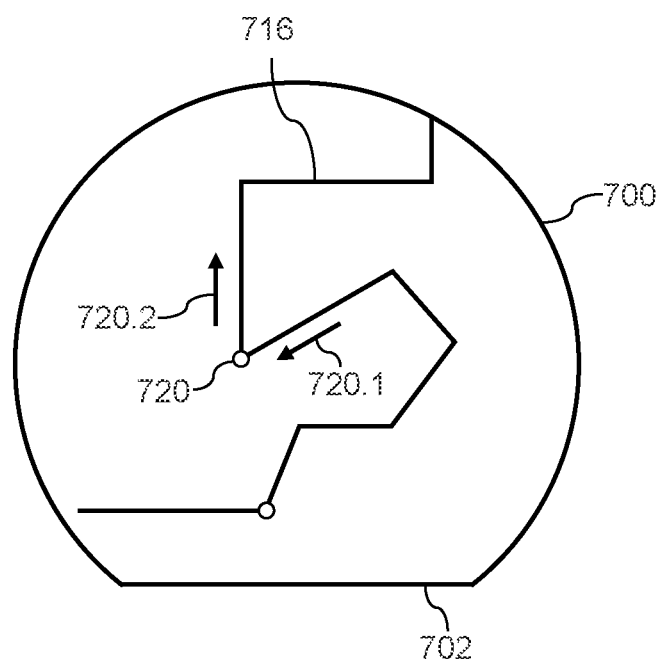
Figure 23:
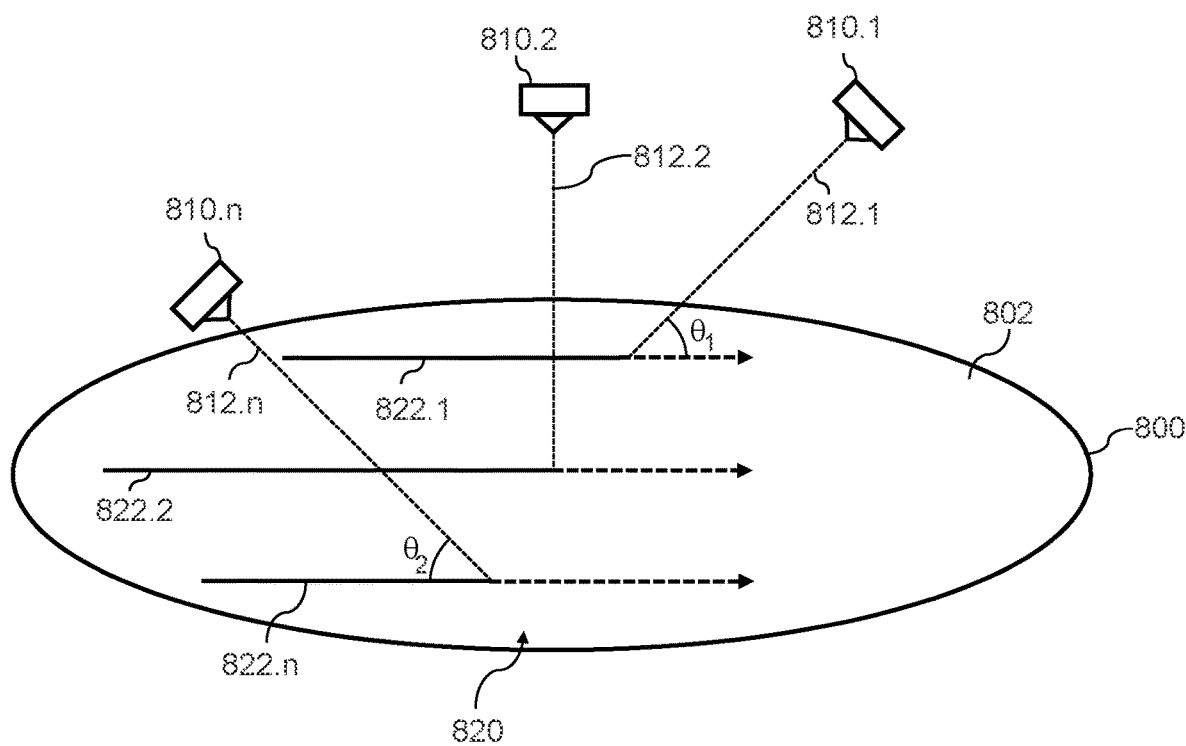
FIG. 23 depicts an array of lasers implementing a laser-based surface processing operation on a semiconductor workpiece according to examples of the present disclosure.

Example laser scan patterns are provided in FIGS. 16-22 below. In addition, FIG. 8 depicts a single laser 202 emitted onto the surface 122 of the semiconductor wafer 120. Multiple lasers (e.g., at distinct incidence angles) may be emitted onto the surface 122 of the semiconductor wafer 120 as shown in FIG. 23 below without deviating from the scope of the present disclosure.

Figure 15:
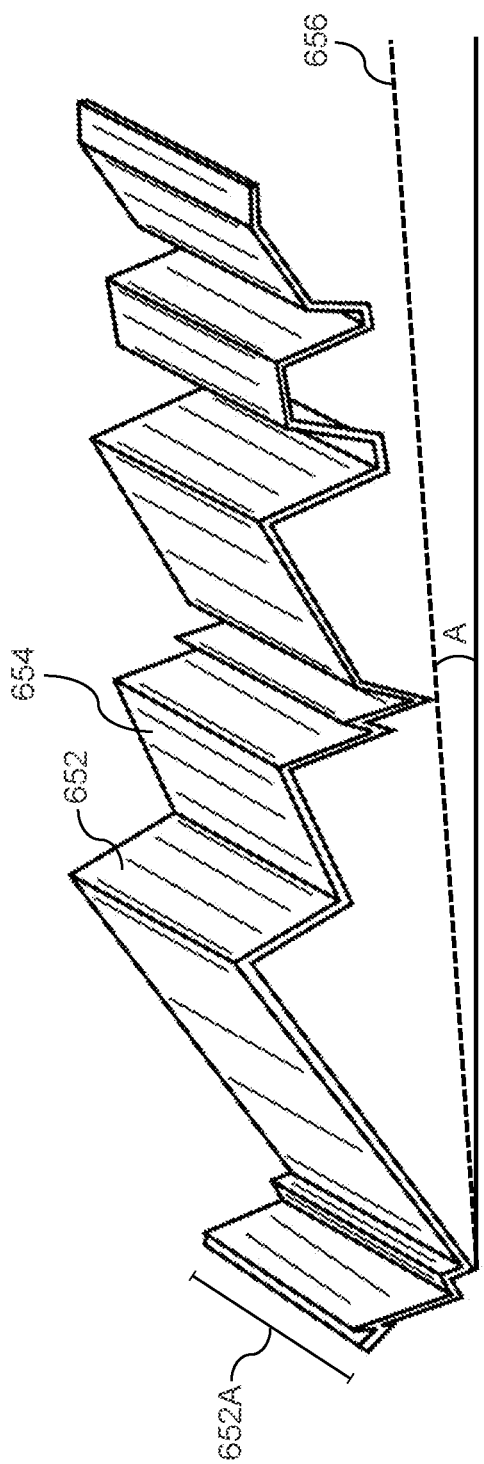
FIG. 15 depicts a perspective view schematic of a surface structure of an off-axis 4H silicon carbide crystal after undergoing a removal process.

In some examples, a semiconductor workpiece (e.g., semiconductor wafer 120 or boule 115) may include step structures 152 illustrated in FIG. 8 that are relative to the c-axis basal plane (e.g., see FIG. 15 for a detailed view). The step structures 152 may result from fracturing an off-axis boule (e.g., boule 15A of FIG. 5C). In some examples, the laser 202 may be emitted relative to a length of a step structure 152 such that a projection of the laser 202 onto the surface 122 of the semiconductor wafer 120 forms a scan angle $\phi$ relative to the length of the step structure 152. In some embodiments, the scan angle $\phi$ may be a generally perpendicular angle. However, the scan angle $\phi$ may be any angle without deviating from the scope of the present disclosure.

In some embodiments, the laser 202 may scan the surface 122 in a direction generally perpendicular to a length of the step structures 152 relative to the c-axis basal plane (e.g., the scan angle $\phi$ is within 150 of 90°). In some examples, the laser 202 may scan the surface 122 in a direction generally parallel to a length of the step structures 152 relative the c-axis basal plane (e.g., the scan angle $\phi$ is 0° or within 150 of 0°). In some examples, the laser 202 may scan the surface 122 in a direction that is not perpendicular and not parallel to a length of the step structures 152 relative to the c-axis basal plane (e.g., the scan angle is in a range of about 200 to about 70°). In some examples, the scan angle $\phi$ may be adjusted (e.g., during scanning of the workpiece) based on one or more workpiece properties and or surface topography of the workpiece. For instance, the scan angle $\phi$ may be adjusted to remain generally perpendicular to a length of one or more trenches or other features in the workpiece.

Figure 9:
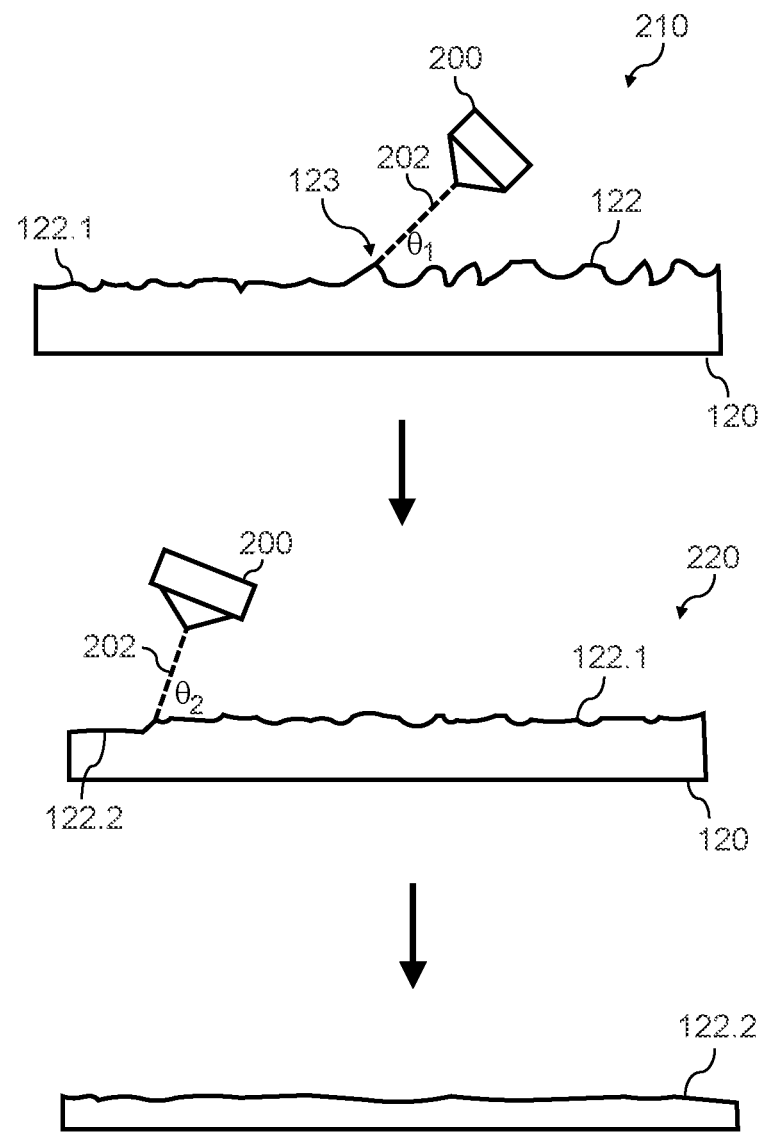
FIG. 9 depicts example laser-based surface processing of a surface according to examples of the present disclosure.

FIG. 9 depicts example laser ablation of the surface 122 of the semiconductor wafer 120 using a laser-based surface processing operation according to examples of the present disclosure. As shown in FIG. 9, a first pass 210 of the laser-based surface processing operation may be implemented on the surface 122 using a laser source 200 at a non-perpendicular incidence angle $\theta_1$ relative to the surface 122. The laser source 200 is configured to provide emission of one or more lasers 202 onto the surface 122. The laser source 200 may include one or more lenses, mirrors, or other optics to focus the laser 202 at a particular focal depth on or below the surface 122 and at a particular non-perpendicular incidence angle $\theta_1$. The laser 202 may intersect the surface 122 at a high point 123 prior to low points in the surface 122, removing peaks from the surface 122 prior to removing valleys from the surface 122. The laser source 200 may emit the laser with sufficient power, pulsing frequency, and pulse duration to remove material from the surface 122 (e.g., silicon carbide) to yield a first laser-based processed surface 122.1.

As shown in FIG. 9, after a first pass 210 of the laser-based surface processing operation, a second pass 220 of the laser-based surface processing operation may be implemented on the surface 122.1 using a laser source 200. The laser source 200 is configured to provide emission of one or more lasers 202 onto the surface 122.1. The laser source 200 may include one or more lenses, mirrors, or other optics to focus the laser 202 at a particular focal depth on or below the surface 122.1 and/or at a particular non-perpendicular incidence angle $\theta_2$. The laser source 200 may emit the one or more lasers 202 with sufficient power, pulsing frequency, and pulse duration to remove material (e.g., silicon carbide) from the surface 122.1 to yield a second laser-based processed surface 122.2.

In some examples, the non-perpendicular incidence angle $\theta_2$ may be different from the non-perpendicular incidence angle $\theta_1$. For instance, the non-perpendicular incidence angle $\theta_2$ may be closer to perpendicular than the non-perpendicular incidence angle $\theta_1$. This may facilitate ablation or removal of material from low points in the surface 122.1 that were unable to be removed using a laser at a lower non-perpendicular incidence angle.

Figure 10:
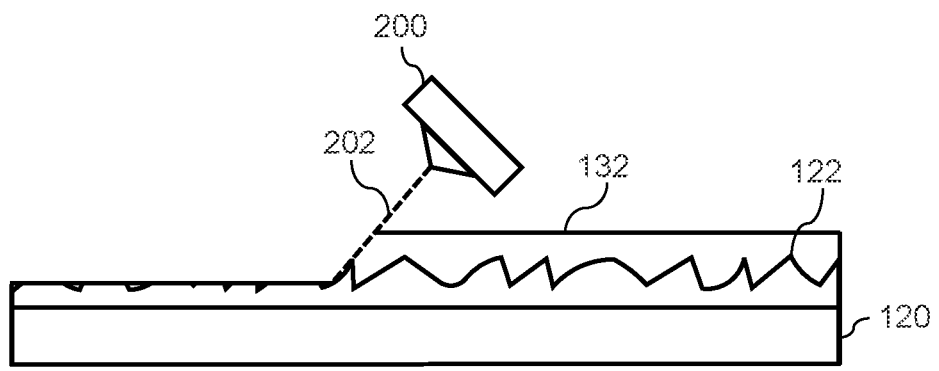
FIG. 10 depicts example laser-based surface processing of a surface with a filler material according to examples of the present disclosure.

Referring to FIG. 10, in some embodiments, a filler material 132 may be added to the surface 122 of the semiconductor wafer 120 prior to implementing the laser-based surface processing operation. The filler material 132 may fill any deep topological areas and cover any higher peaks to create a planarized surface on the semiconductor wafer 120.

The filler material 132 may have a matched removal rate to the material of the semiconductor wafer 120 (e.g., silicon carbide) for a laser ablation process. For instance, the removal rate associated with the semiconductor workpiece (i.e., the semiconductor wafer 120 or boule 115), may be within 20% of the removal rate associated with the filler material 132.

The filler material 132 may facilitate creating a planar surface with low surface roughness as a result of the laser ablation process. For instance, by using the filler material 132 to create a planar surface on the surface 122 of the semiconductor wafer 120 undergoing the example laser ablation of the surface demonstrated in FIG. 9, the resulting surface 122.1 will have a lower surface roughness.

In some examples, the filler material 132 may be a sol-gel defined liquid. In some examples, the filler material 132 may be a spin-coatable glass. In some examples, the filler material 132 may be a ceramic composite. In some examples, the filler material 132 may be or include organosilicone, such as tetraethyl orthosilicate (TEOS), tetramethylcyclotetrasiloxane (TMCTS), polydimethylsiloxane (PDMS), cyclic siloxanes, or related compounds. In some examples, the filler material 132 may be a hydrate with a metal oxide precursor (e.g., ZnO×H$_2$O) or nitrate precursor (e.g., Ga(NO$_3$)$_3$×H$_2$O). While example filler materials 132 have been discussed herein, it should be appreciated that any sol gel processes that creates liquid processable materials with properties required for a selected surface removal process may be used as a filler material 132 according to the present disclosure.

In some examples, the filler material 132 may be a non-sol gel material that may fill the substrate surface topography. For instance, the filler material 132 may be a curable liquid composite that may be engineered to fill voids, adhere to surfaces, and be curable into a hard solid through a curing process via exposure to radiation (e.g., visible light or UV light). In some examples, the filler material 132 may be cured through any suitable curing processes, such as photocuring, thermal curing, chemical curing, microwave curing, pressure curing, ambient curing, electromagnetic radiation curing, electrochemical curing, or other suitable curing processes.

As an example, the filler material 132 may be a photocurable resin-based composite (PCRB). Suitable PCRB's may be a mixture of photopolymerizable monomers, photoactive polymerization initiators, and a surface functionalized filler (SFF).

In some examples, the PCRB may include a resin binder with a mixture of two methacrylate terminated monomers that may include, for instance, a base monomer and diluent monomer. Example base monomers may include, for instance, bisphenol A glycol dimethacrylate (Bis-GMA), ethoxylated bisphenol A glycol dimethacrylate (Bis-EMA), or urethane dimethacrylate (UDMA). Example dilutant monomers may include, for instance, triethylene glycol dimethacrylate (TEDGMA), decanediol dimethacrylate (D3MA), or 2-hydroxyethyl methacrylate (HEMA). Filler materials that include a PCRB with a resin binder may be curable using a free radical initiator. Example free radical initiators may include a camphorquinone mixed with an amine photo-polymerization accelerator such as ethyl 4-(dimethylamino) benzoate, N,N-dimethylaminoethyl methacrylate, 2-ethyl-dimethylbenzoate, N,N-dimethyl-p-toluidine, or N-phenylglycine.

In some examples, the SFF in the PCRB may include micro-particles or nanoparticles of, for instance, ceramics, inorganic compounds, metals, metalloids, minerals, non-metallic elements, inorganic-inorganic hybrid materials, inorganic-inorganic composites, organic compounds, organic-inorganic hybrid materials, organic-inorganic composites, or similar materials. The SFFs may include microparticles or nanoparticles with matched properties to a semiconductor wafer material and surface removal process. In some example SFFs, compounds may be used to functionalize the surface of the particles, promote dispersion and couple to the resin matrix during curing of a PCRB. In some examples, these compounds may include 10-methacryloyloxydecyl dihydrogen phosphate, dipentaerythritol pentaacrylate phosphate, thiourethane oligomers, or similar materials.

Figure 11:
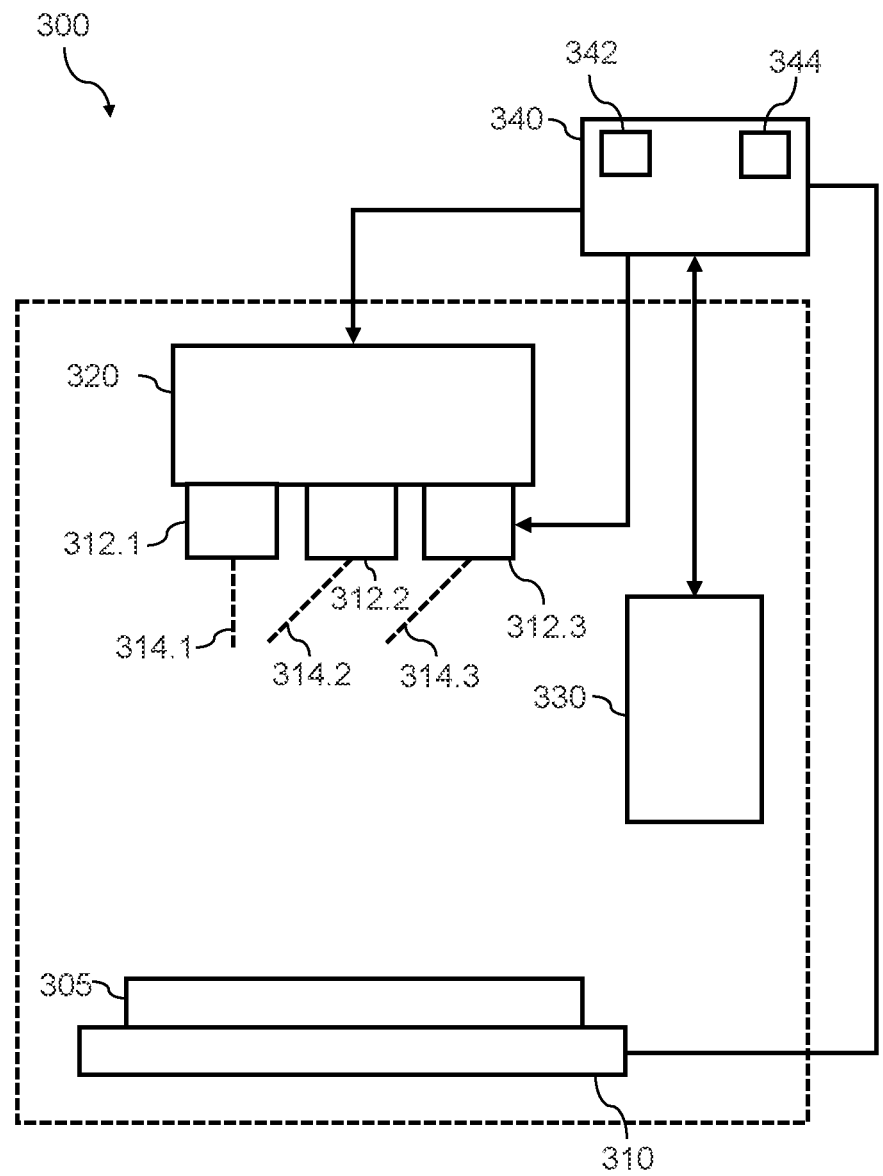
FIG. 11 depicts an example laser processing system according to examples of the present disclosure.

FIG. 11 depicts an example laser processing system 300 according to examples of the present disclosure. The laser processing system 300 may be configured to implement one or more aspects of the present disclosure, such as the off-axis laser-based surface processing operations provided herein and/or laser-based removal processes for removing a semiconductor wafer from a boule.

The laser processing system 300 includes one or more laser sources 312.1, 312.2, 312.3, . . . , 312.n. The one or more laser sources 312.1, 312.2, 312.3, . . . , 312.n may each be configured to respectively emit a laser 314.1, 314.2, 314.3, . . . , 314.n in accordance with various laser parameters. The laser parameters may include, for instance, focusing depth, laser power, laser wavelength, laser pulse duration, laser pulse frequency, laser pulse energy, laser incidence angle, scan pattern, scan angle (e.g., relative to surface topography, such as step structures), etc. For instance, each of the one or more laser sources 312.1, 312.2, 312.3 . . . , 312.n may be configured to emit lasers 314.1, 314.2, 314.3, . . . , 314.n at a non-perpendicular and/or a perpendicular incidence angle relative to the surface of a workpiece 305.

The laser sources 312.1, 312.2, 312.3, . . . , 312.n may each be associated with one or more wavelengths and may be, for instance, one or more of an excimer laser, UV laser, visible light laser, infrared laser, single wavelength laser, multiwavelength laser, white laser, etc. The laser sources 312.1, 312.2, 312.3, . . . , 312.n may each be associated with a pulse duration and may be one or more of an attosecond laser, femtosecond laser, nanosecond laser, etc. The laser sources 312.1, 312.2, 312.3, . . . , 312.n may each be associated with a lasing medium and may be, for instance, a gas (e.g., CO$_2$) laser, solid state laser (e.g., GaN, AlGaN, YAG, etc.), diode laser, fiber laser, etc. The laser sources 312.1, 312.2, 312.3, . . . , 312.n may be one or more of a single frequency laser, frequency doubled laser, frequency tripled laser, frequency quadrupled laser, etc.

The laser sources 312.1, 312.2, 312.3, . . . , 312.n may each be the same type of laser source or different types of laser sources. The laser sources 312.1, 312.2, 312.3, . . . , 312.n may be configured to emit lasers 314.1, 314.2, 314.3, . . . , 314.n in accordance with the same laser parameters or different laser parameters.

For instance, in some embodiments, the laser processing system 300 may include a first laser source 312.1, a second laser source 312.2, and a third laser source 312.3. In some embodiments, the first laser source 312.1 may be operable to emit a laser 314.1 with laser parameters sufficient to perform a laser-based removal process, such as the laser-based removal process shown at 102 of FIG. 6. The first laser source 312.1 may be operable to emit a laser 314.1 at a first incidence angle (e.g., generally perpendicular or non-perpendicular incidence angle).

The second laser source 312.2 may be operable to emit a laser 314.2 with laser parameters sufficient to perform a laser-based surface processing operation according to examples of the present disclosure. In some examples, the second laser source 312.2 may be operable to emit a laser 314.2 at a second incidence angle (e.g., generally perpendicular or non-perpendicular incidence angle). In some embodiments, the second laser source 312.2 may be configured to emit a second laser 314.2 in accordance with the following laser parameters:

Laser wavelength: about 190 nanometers to about 1100 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers, such as about 532 nanometers, such as about 1064 nanometers, such as about 1080 nanometers; or multiple wavelengths (e.g., white light) including any of the foregoing;

Laser pulse frequency: about 1 kilohertz to about 200 kilohertz, such as about 10 kilohertz to about 150 kilohertz, such as about 20 kilohertz to about 100 kilohertz;

Laser power: 0.1 watts to about 500 watts, such as about 0.5 watts to about 100 watts, such as about 1 watt to about 40 watts, such as about 1 watt to about 10 watts;

Laser pulse duration: about 0.1 femtoseconds to about 300 nanoseconds; such as about 1 femtosecond to about 500 picoseconds, such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joules, such as about 10 nanojoules to about 200 millijoules.

The third laser source 312.3 may be configured to emit a third laser 314.3 with laser parameters sufficient to perform a laser-based surface processing operation (e.g., laser ablation process). In some examples, the third laser source 312.3 may be operable to emit a laser 314.3 at a third incidence angle (e.g., generally perpendicular or non-perpendicular incidence angle). The first incidence angle may be different from the second incidence angle and may be different from the third incidence angle. In some embodiments, the third laser source 312.3 may be configured to emit a third laser 314.3 in accordance with the following fine laser parameters:

Laser wavelength: about 190 nanometers to about 1100 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers, such as about 532 nanometers, such as about 1064 nanometers, such as about 1080 nanometers; or multiple wavelengths (e.g., white light) including any of the foregoing;

Laser pulse frequency: about 1 kilohertz to about 200 kilohertz, such as about 10 kilohertz to about 150 kilohertz, such as about 20 kilohertz to about 100 kilohertz;

Laser power: 0.1 watts to about 500 watts, such as about 0.5 watts to about 100 watts, such as about 1 watt to about 40 watts, such as about 1 watt to about 10 watts;

Laser pulse duration: about 0.1 femtoseconds to about 300 nanoseconds; such as about 1 femtosecond to about 500 picoseconds, such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joules, such as about 10 nanojoules to about 200 millijoules.

FIG. 11 depicts three laser sources 312.1, 312.2, 312.3 for purposes of illustration and discussion. Those of ordinary skill in the art, using the disclosures provided herein, will understand that the system 300 may include more or fewer laser sources without deviating from the scope of the present disclosure. For instance, the system 300 may include a plurality of first laser sources 312.1 operable to emit a laser 314.1 with laser parameters sufficient to perform a laser-based removal process or a laser-based surface processing operation. The system 300 may include a plurality of second laser sources 312.2 operable to emit a laser 314.2 with laser parameters sufficient to perform a laser-based removal process or a laser-based surface processing operation (e.g., as discussed with reference to FIG. 23). The system 300 may include a plurality of third laser sources 312.3 operable to emit a laser 314.3 with laser parameters sufficient to perform a laser-based removal process or a laser-based surface processing operation (e.g., as discussed with reference to FIG. 23).

The system 300 may include one or more additional laser sources to provide different functionality. In some examples, the system 300 may include one or more laser sources operable to scribe a fiducial workpiece mark or ID mark on the workpiece. In some examples, the system 300 may include one or more laser sources configured to singulate or cut a plurality of semiconductor die from the workpiece. In some examples, the system 300 may include one or more laser sources configured to obtain metrology (e.g., surface topology measurements) of a workpiece 305. In some examples, the system 300 may include one or more laser sources configured to provide a laser-based processing operation on a workpiece edge (e.g., wafer edge).

The system 300 includes a workpiece support 310 configured to support a semiconductor workpiece 305 (e.g. boule 115 and/or semiconductor wafer 120). The workpiece support 310 may include a chuck (e.g., vacuum chuck) or other mechanism to hold the workpiece 305 in place during laser processing according to examples of the present disclosure.

The one or more laser sources 312.1, 312.2, 312.3, . . . , 312.n may be coupled to a translation stage 320 that may move the one or more laser sources 312.1, 312.2, 312.3, . . . , 312.n relative to the workpiece. In addition, the laser sources 312.1, 312.2, 312.3, . . . , 312.n and/or translation stage 320 may include one or more optics (e.g., lens, mirrors, etc.) to facilitate moving the lasers 314.1, 314.2, 314.3, . . . , 314.n from the laser sources relative to the workpiece 305. In addition, or in the alternative, the workpiece support 310 may be operable to move the workpiece 305 relative to the one or more lasers 314.1, 314.2, 314.3, . . . , 314.n. In this way, the system 300 may be able to control the translation stage 320 and/or the workpiece support 310 to impart relative motion between the lasers 314.1, 314.2, 314.3, . . . , 314.n and the workpiece 305 to implement laser-based removal processes and/or laser-based surface processing operations according to examples of the present disclosure. In some examples, the translation stage 320 and/or the workpiece support 310 may be controlled to impart relative motion between the lasers 314.1, 314.2, 314.3, . . . , 314.n and the workpiece 305 to scan at least 85% of the surface through relative motion between the one or more lasers and the surface, such as at least 95% of the exposed surface, such as at least 99% of the surface to implement laser processing according to examples of the present disclosure. However, in some examples, the translation stage 320 and/or the workpiece support 310 may be controlled to scan a smaller portion of the surface of the workpiece 305 without deviating from the scope of the present disclosure. Example scanning patterns are provided in FIGS. 16-22.

For instance, in some examples, one or more lasers may scan less of the surface, such as less than about 50% of the surface. For instance, in examples involving patterning of the surface of a workpiece with areas of sub-surface damage for fiducial marking, dicing, etc., the one or more lasers may scan about 50% or less of the surface.

In some embodiments, the laser processing system 300 may additionally include one or more sensors 330 for obtaining data associated with the workpiece 305, such as workpiece property data for the workpiece 305. The workpiece property data may include, for instance, data associated with a surface of the workpiece 305 (e.g., topology, roughness), subsurface regions of the workpiece 305, optical properties of the workpiece 305, temperature of the workpiece 305, doping level of the workpiece 305, polytype of the workpiece 305 (e.g., 4H, 6H), or other parameters.

In some embodiments, the one or more sensors 330 may include, for instance, an optical sensor, such as an image capture device (e.g., camera) that may capture images at one or more wavelengths of visible light, ultraviolet light, and/or infrared light. In some embodiments, the one or more sensors 330 may include one or more surface measurement lasers that may be operable to emit a laser onto the surface of the workpiece 305 and scan the surface (based on reflections of the laser) for depth measurements, topography measurements, etc. of the surface of the workpiece 305. Other suitable sensors may be used without deviating from the scope of the present disclosure.

The laser processing system 300 includes one or more control devices, such as a controller 340. The controller 340 may include one or more processors 342 and one or more memory devices 344. The one or more memory devices 344 may store computer-readable instructions that when executed by the one or more processors 342 cause the one or more processors 342 to perform one or more control functions, such as any of the functions described herein. The controller 340 may be in communication with various other aspects of the laser processing system 300 through one or more wired and/or wireless control links. The controller 340 may send control signals to the various components of the laser processing system 300 (e.g., the laser sources 312.1, 312.2, 312.3, ..., 312.*n*, the workpiece support 310, the sensor 330) to implement a laser processing operation on the workpiece 305.

In some embodiments, the controller 340 may control aspects of the laser processing system 300 (e.g., the laser sources 312.1, 312.2, 312.3, ..., 312.*n*) based at least in part on data from the sensor(s) 330. For instance, the controller 340 may adjust various laser parameters for the lasers 314.1, 314.2, 314.3, ..., 314.*n* emitted by the laser sources 312.1, 312.2, 312.3, ..., 312.*n* based at least in part on data from the sensor(s) 330. The laser parameters may include, for instance, one or more of focusing depth, laser power, laser wavelength, laser pulse duration, laser pulse frequency, laser pulse energy, scan pattern, scan angle (e.g., relative to surface topography, such as step structures), and/or translation speed. In some embodiments, the laser parameters may include incidence angle of the lasers 314.1, 314.2, 314.3, ..., 314.*n* on the workpiece 305. For instance, the controller 340 may be configured to adjust one or more of the aspects of the laser processing system 300 to adjust the incidence angle of at least one of the one or more lasers 312.1, 312.2, 312.3, ..., 312.*n* relative to the surface of the workpiece 305.

In some embodiments, the laser sources 312.1, 312.2, 312.3 ..., 312.*n* may include an adaptive optics system that may include one or more lenses, mirrors, or other optical devices. The lenses, mirrors, or other optical devices may be moved or adjusted to adjust one or more of the one or more laser parameters. For instance, the one or more lenses may be swapped or adjusted to change a focal depth of the lasers 314.1, 314.2, 314.3 ..., 314.*n*.

In some examples, the controller 340 may be configured to adjust one or more laser parameters based on sensor data associated with a current workpiece 305 undergoing a laser-based surface processing operation (e.g., dynamic adjustment during or after a laser-based surface processing operation) or based on sensor data associated with past semiconductor workpieces that had previous undergone a laser-based surface processing operation.

Figure 12:
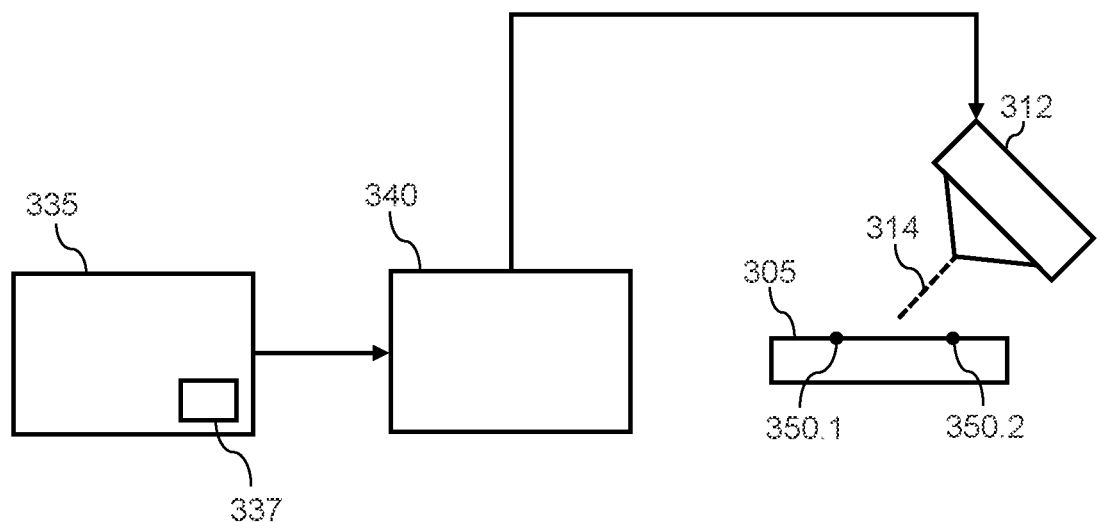
FIG. 12 depicts an overview of example control of a laser source based at least in part on sensor data from one or more sensors according to examples of the present disclosure.

FIG. 12 depicts an overview of example control of a laser source 312 based at least in part on sensor data 335 from the one or more sensors 330 or other data (e.g., from metrology tools) according to examples of the present disclosure. As shown, the sensor data 335 may be provided to the controller 340 (e.g., through a communication link). The sensor data 335 may include, for instance, workpiece property data 337. Workpiece property data 337 may include data associated with a surface of the workpiece 305 (e.g., topology, roughness), subsurface regions of the workpiece 305, optical properties of the workpiece 305, temperature of the workpiece 305, doping level of the workpiece 305, polytype of the workpiece 305 (e.g., 4H, 6H), or other parameters. In some examples, the workpiece property data 337 may include data associated with a surface topology of the workpiece. In some examples, the workpiece property data 337 may include an image of the exposed surface obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topology, optical properties, etc.

The controller 340 may determine one or more laser parameters for the laser 314 by the laser source 312 on the workpiece 305 based on the sensor data 335, such as laser incidence angle. For instance, in some embodiments, the controller 340 may access a model, algorithm, function, lookup table, machine-learned model, etc., that correlates one or more laser parameters based on the data and/or position on the workpiece 305.

In some embodiments, the one or more laser parameters are specified as a function of both a position on the workpiece 305 and sensor data 335 or other data associated with that specific position. For instance, the controller 340 may determine a first incidence angle for the laser 314 for ablating or removing material at a first position 350.1 on the workpiece 305. The controller 340 may determine a second incidence angle for the laser 314 for ablating or removing material at a second position 350.2 on the workpiece 305. The first incidence angle may be different from or the same as the second incidence angle.

In some examples, the laser source 312 may be dynamically adjusted, or tuned, during a laser surface processing operation. The one or more sensors 330 may provide sensor data 335 to the controller 340 and the controller 340 may determine, or adjust, one or more laser parameters for the laser 314 based on the sensor data 335 while performing the laser surface processing operation. For instance, the one or more sensors 330 may provide a surface topography of the workpiece 305 to the controller 340 while the laser 314 is processing the surface of the workpiece 305. The controller 340 may then adjust one or more laser parameters of the laser 314 based on the data while the laser 314 is still processing the surface of the workpiece 305. In this way, the one or more laser parameters may be dynamically adjusted, or tuned, during laser surface processing operations.

In some examples, the one or more laser parameters of the laser source 312 may be adaptively tuned, or adjusted, through multiple laser surface processing operations. The one or more sensors 330 may aggregate data regarding the workpiece 305 before, during, and after a laser surface processing operation and provide it to the controller 340. The controller 340 may then tune one or more laser parameters of the laser source 312 based on the aggregated data from the one or more sensors 330. For instance, the laser source 312 may include a set of one or more laser parameters for a laser surface processing operation. The laser source 312 may perform a laser surface processing operation on the surface of a workpiece 305 and the one or more sensors 330 may obtain data regarding the surface of the workpiece 305 after the operation. The data regarding the surface of the workpiece 305 may then be provided to the controller 340 which may adjust, or tune, one or more of the set laser parameters associated with the laser source 312 and reprocess the surface of the workpiece 305. In some examples, the one or more laser parameters may be adaptively tuned for future laser surface processing operations and/or future additional workpiece(s) 305. For instance, the controller 340 may determine one or more laser parameter adjustments based on one or more laser surface processing operations on a first workpiece 305 and apply the adjustments to one or more laser parameters for a laser surface processing operation on a second workpiece 305.

Figure 13:
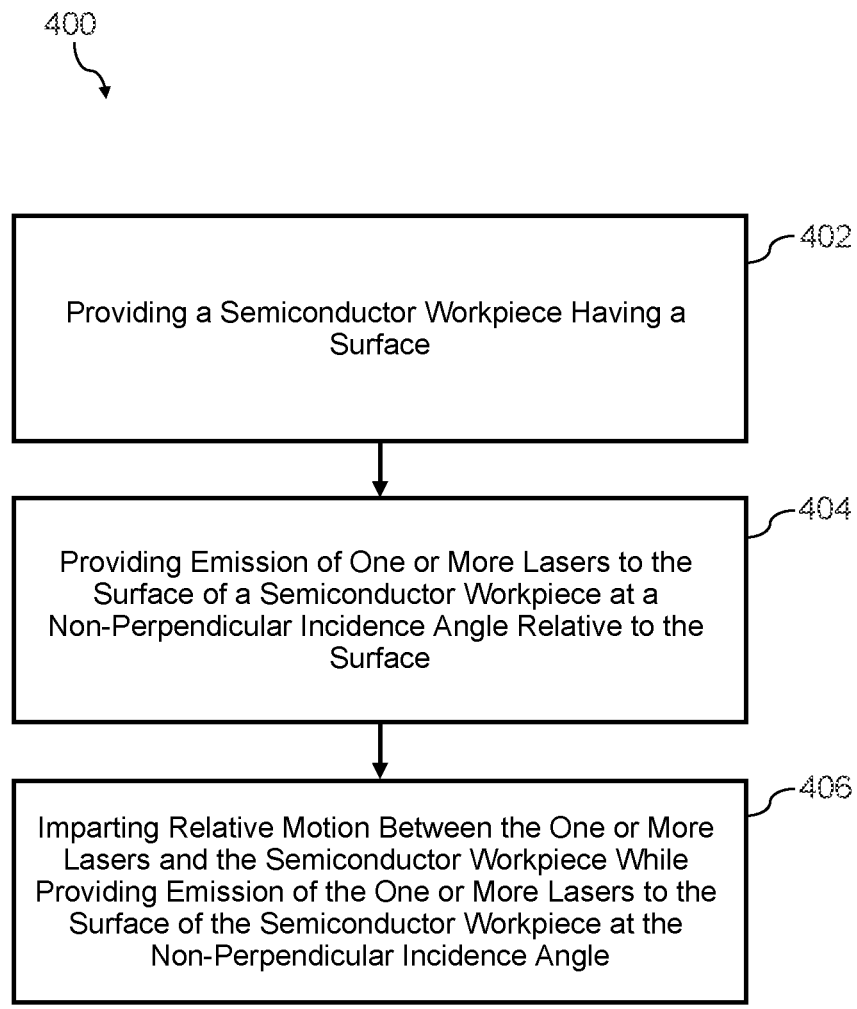
FIG. 13 depicts a flow chart diagram of an example method according to examples of the present disclosure.

FIG. 13 depicts a flow chart diagram of an example method 400 according to aspects of the present disclosure. FIG. 13 is intended to represent structures for identification and description and is not intended to represent the structures to physical scale. The method 400 depicts operations in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 402, the method 400 includes providing a semiconductor workpiece having a surface. The semiconductor workpiece may be a semiconductor wafer or a boule. Additionally, the semiconductor workpiece may be made of a variety of materials. For instance, the semiconductor workpiece may include silicon carbide, such as an off-axis 4H silicon carbide crystalline material. The surface of the semiconductor workpiece may have a generally rougher surface roughness prior to undergoing the method 400, such as a surface roughness of about 65 microns or greater. In some examples, providing the semiconductor workpiece may include separating the semiconductor workpiece from a boule using a removal process (e.g., laser-based removal process or wire saw-based removal process).

At 404, the method 400 includes providing emission of one or more lasers to the surface of a semiconductor workpiece at a non-perpendicular incidence angle relative to the surface. The non-perpendicular incidence angle may be any acute angle relative to the surface, such as 75° or less, such as 45°, such as 30°, such as 15°. The one or more lasers may be emitted through one or more optics (e.g., lenses, mirrors, etc.) to process the surface of the semiconductor workpiece. In some examples, the emission of the one or more lasers may reduce the thickness of the semiconductor workpiece, such as by at least about 25 microns.

In some examples, emitting the one or more lasers to the surface of the semiconductor workpiece may reduce the surface roughness of the workpiece. For instance, the one or more lasers may reduce the surface roughness of the surface to a range of about 20 nanometers to about 65 microns. As another example, the one or more lasers may reduce the surface roughness of the surface to a range of about 0.5 nanometers to about 180 nanometers, such as about 0.5 nanometers to about 125 nanometers.

At 406, the method includes imparting relative motion between the one or more lasers and the semiconductor workpiece while providing emission of the one or more lasers to the surface of the semiconductor workpiece at the non-perpendicular incidence angle. Imparting relative motion may be performed in a variety of ways. For example, imparting relative motion may include adjusting one or more optics or rotating the semiconductor workpiece. Additionally, in some examples, imparting relative motion may include adjusting the non-perpendicular incidence angle of the one or more lasers. The non-perpendicular incidence angle may be adjusted based on a variety of factors. For example, the non-perpendicular incidence angle may be adjusted based on a number of scans of the one or more lasers, a surface roughness of the surface, and/or a removal depth of the semiconductor workpiece.

In some examples, the scan angle (e.g., scan angle of FIG. 8) may be adjusted (e.g., during scanning of the workpiece) based on one or more workpiece properties and/or surface topography of the workpiece. For instance, the scan angle may be adjusted to remain generally perpendicular to a length of one or more trenches or other features in the workpiece.

Figure 14:
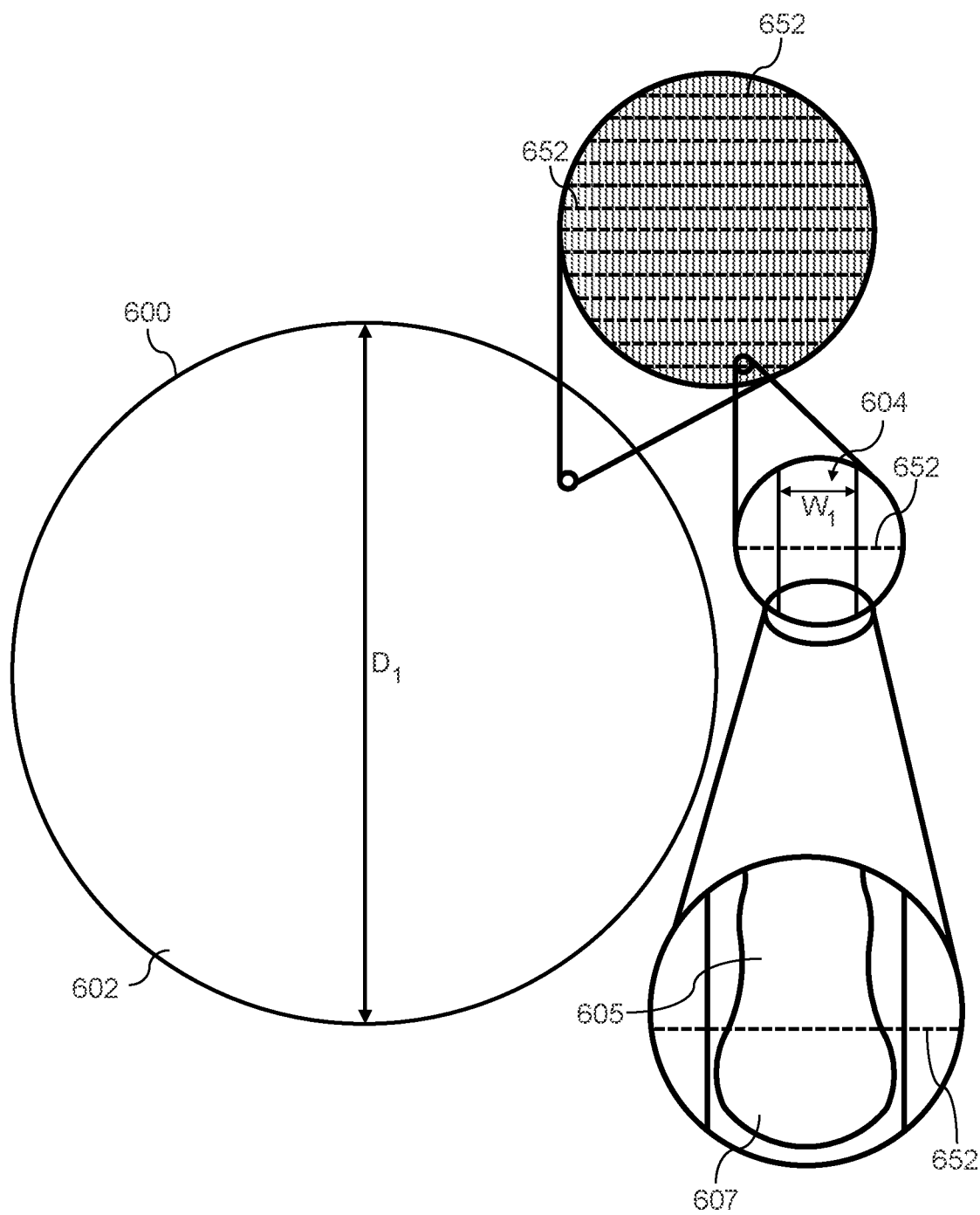
FIG. 14 depicts a semiconductor wafer according to examples of the present disclosure.

FIG. 14 depicts an example semiconductor wafer 600 that has been subjected to a laser-based surface processing operation according to examples of the present disclosure. The semiconductor wafer 600 may include silicon carbide. In some examples, the semiconductor wafer 600 may include, for instance, 4H silicon carbide or 6H silicon carbide. In some examples, the semiconductor wafer 600 comprises an off-axis silicon carbide crystalline material.

In some examples, the semiconductor wafer 600 has a diameter D1 in a range of about 100 millimeters to about 300 millimeters, such as in a range of about 100 millimeters to about 200 millimeters, such as about 100 millimeters, such as about 150 millimeters, such as about 200 millimeters. The semiconductor wafer 600 may have thickness of less than about 500 microns, such as less than about 300 microns, such as less than about 200 microns, such as in a range of about 100 microns to about 200 microns, such as in a range of about 120 microns to 180 microns.

The semiconductor wafer 600 may have a laser-defined surface 602. A close-up of the laser-defined surface 602 is shown in FIG. 14. The laser-defined surface 602 has a plurality of laser-defined features (e.g., ablated strips) arranged in a regular pattern. The regular pattern corresponds to the scanning path of the laser during a laser-based surface processing operation. Each laser defined feature 604 may have a width w1 corresponding generally to a scan dimension associated with the laser during the laser scan. The width w1 may be in a range of about 10 microns to about 25 millimeters, in some embodiments.

As shown in FIG. 15, each laser-defined feature 604 may be an ablated strip. Each ablated strip may have one or more pulse spots 605 along the ablated strip. The pulse spot 605 may be associated with a laser pulse removing material from the laser-defined surface 602. As shown in FIG. 15, the pulse spot 605 may be asymmetrical as a result of the laser pulse coming from a non-perpendicular incidence angle. The pulse spot 605 may have a "tail" 607 of reduced width in a direction corresponding to the direction of the non-perpendicular incidence angle.

In some embodiments, the laser-defined surface 602 may have a surface roughness in a range of about 20 nanometers to about 65 microns. In some embodiments, the laser-defined surface 602 may have a surface roughness in a range of about 0.5 nanometers to about 180 nanometers, such as about 0.5 nanometers to about 125 nanometers, such about 1 nanometer to about 100 nanometers, such as between about 2 nanometers and about 50 nanometers.

In some examples, there may be a distance between laser-defined features (e.g., ablated strips) in the laser-defined surface. The distance between each scan or pass may be, for instance, in a range of about 0 millimeters to about 1 millimeter, such as about 0 millimeters to about 500 microns. In some examples, there may be no distance between laser-defined features (e.g., ablated strips) in the laser-defined surface. In some examples there may be overlap between laser-defined features (e.g., ablated strips) on the laser-defined surface.

In some examples, the semiconductor wafer 600 may include an off-axis 4H silicon carbide material. The surface of the semiconductor workpiece may have one or more step structures relative to a c-axis basal plane. For instance, FIG. 15 depicts a perspective view schematic of a surface structure of an off-axis 4H silicon carbide crystal (having an angle A relative to a c-axis basal plane) after undergoing a removal process (e.g., laser-based removal process). The surface exhibits step structures 652 and terraces 654 relative to a c-axis basal plane 656. The step structures 652 may have differing slopes, lengths, and patterns as shown in FIG. 15. The dimension 652A in FIG. 15 represents the dimension of the step structures 652 corresponding to the length of the step structures 652.

The locations of example step structures 652 are illustrated by dashed lines in FIG. 14. As illustrated, the laser-defined features (e.g., ablated strips) have a length extending a direction that is generally perpendicular to a direction associated with the length of the step structures 652. However, the laser-defined features (e.g., ablated strips) may have a length extending in other directions relative to the length of the step structure 652 without deviating from the scope of the present disclosure, such as generally parallel to the length of the step structures 652 or at a non-perpendicular or non-parallel angle with respect to the length of the step structures 652.

Figure 16:
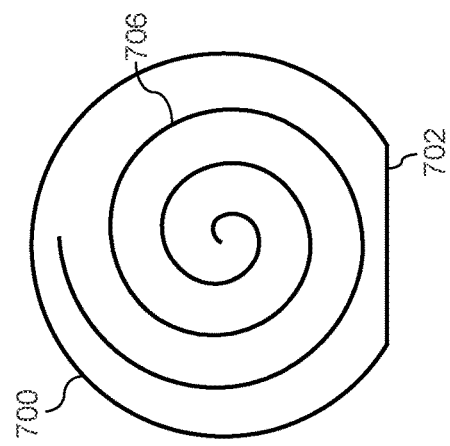
FIGS. 16-22 depicts example scan patterns for a laser-based surface processing operation according to examples of the present disclosure.

According to aspects of the present disclosure, the one or more lasers may scan the surface of a workpiece in any suitable pattern. FIG. 16 depicts an example scan pattern 704 on an example semiconductor wafer 700 (e.g., silicon carbide semiconductor wafer) according to example embodiments of the present disclosure. The scan pattern depicted in FIG. 16 comprises a plurality of parallel scans or passes in a direction generally perpendicular to, for instance, a flat 702 of the semiconductor wafer 700.

Figure 17:
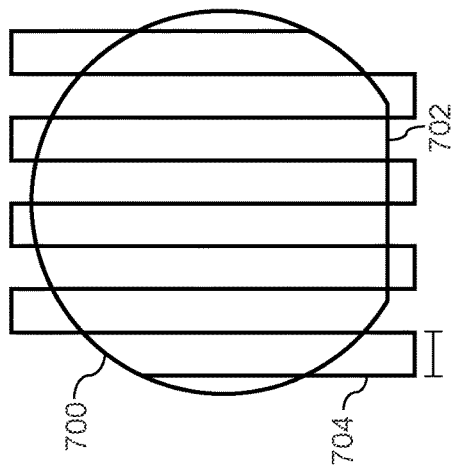

FIG. 17 depicts an example scan pattern 706 on an example semiconductor wafer 700 (e.g., silicon carbide semiconductor wafer) according to example embodiments of the present disclosure. The scan pattern 706 depicted in FIG. 17 comprises a spiral scan pattern on a surface of the semiconductor wafer 700.

Figure 18:
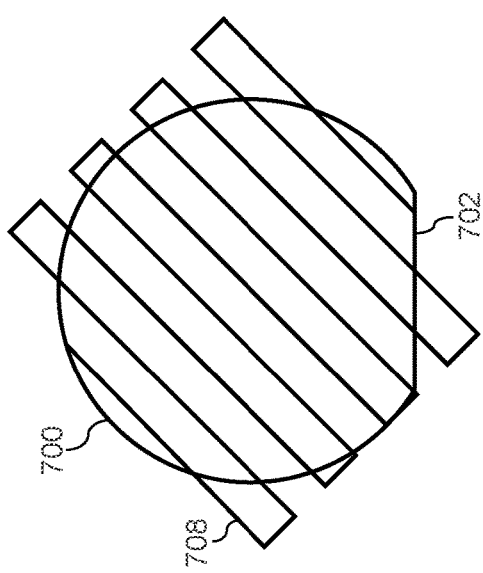

FIG. 18 depicts an example scan pattern 708 on an example semiconductor wafer 700 (e.g., silicon carbide semiconductor wafer) according to example embodiments of the present disclosure. The scan pattern 708 depicted in FIG. 18 comprises a plurality of generally parallel scans or passes in a direction that is angled (not generally perpendicular and not generally parallel) to, for instance, a flat 702 of the semiconductor wafer 700.

Figure 19:
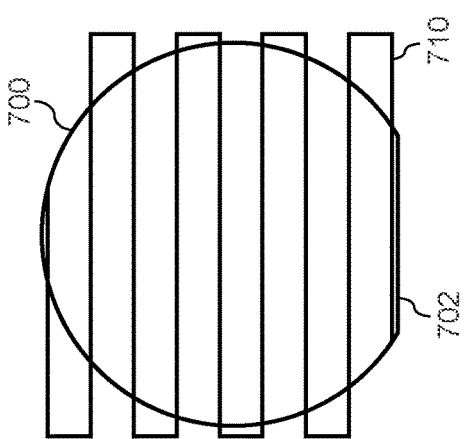

FIG. 19 depicts an example scan pattern 710 on an example semiconductor wafer 700 (e.g., silicon carbide semiconductor wafer) according to example embodiments of the present disclosure. The scan pattern 710 depicted in FIG. 19 comprises a plurality of generally parallel scans or passes in a direction that is generally parallel to, for instance, a flat 702 of the semiconductor wafer 700.

Figure 20:
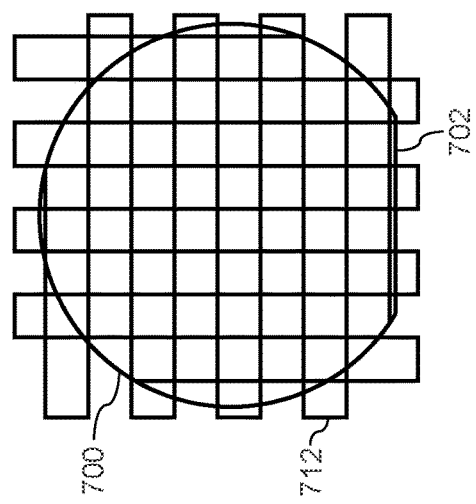

FIG. 20 depicts an example scan pattern 712 on an example semiconductor wafer 700 (e.g., silicon carbide semiconductor wafer) according to example embodiments of the present disclosure. The scan pattern 712 depicted in FIG. 20 comprises a plurality of generally parallel scans or passes and a plurality of generally perpendicular scans or passes to, for instance, a flat 702 of the semiconductor wafer 700.

Other suitable laser scan patterns may be used without deviating from the scope of the present disclosure. For instance, the laser scan pattern may be an irregular or a random scan pattern. As additional non-limiting examples, the laser scan pattern may be a spot pattern, non-continuous pattern, zig zag pattern, herringbone pattern, chevron pattern, array of polygons, concentric circles, or other suitable pattern. In some examples, the workpiece may be rotated while the one or more lasers are implementing the laser scan pattern. In some examples, a density of laser scan lines for a first portion of the semiconductor workpiece may be different from a density of laser lines for a second portion of the semiconductor workpiece. For instance, the density of laser scans may be higher on portions of the semiconductor workpiece with increased surface roughness relative to other portions of the semiconductor workpiece.

Figure 21:
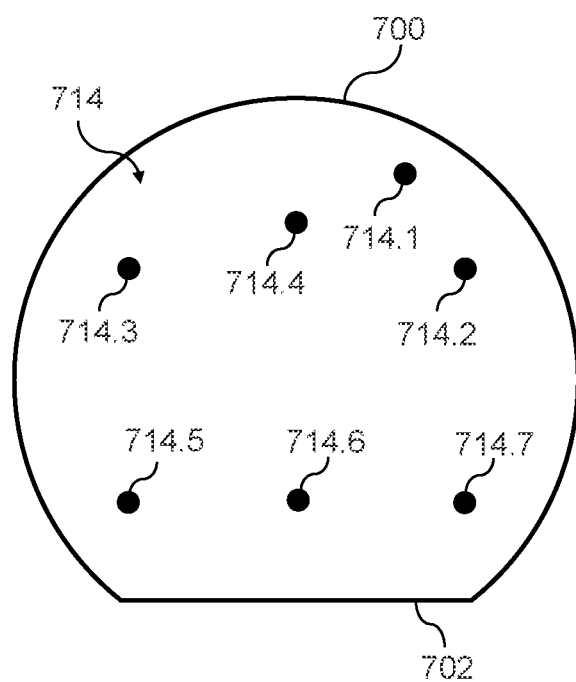

For instance, FIG. 21 depicts an example non-continuous scan pattern 714 on an example semiconductor wafer 700 (e.g., silicon carbide semiconductor wafer) according to example embodiments of the present disclosure. The scan pattern 714 depicted in FIG. 21 includes a plurality of discrete and separated scan points 714.1, 714.2, ... 714.n on the semiconductor wafer 700. For instance, workpiece property data (e.g., sensor data associated with one or more workpiece properties) may indicate the presence of local peak topographical areas on the semiconductor wafer 700. The laser scan pattern 714 can provide emission of the laser on the discrete points 714.1, 714.2, ... 714.n to remove the local peak topographical areas. The discrete points can be in a regular pattern or in a scattered, irregular pattern.

In some embodiments, the scan pattern and/or scan angle (e.g., scan angle #) may be adjusted (e.g., while scanning the semiconductor wafer) based on data, such as sensor data associated with one or more workpiece properties. For instance, FIG. 22 depicts an example scan pattern 718 on an example semiconductor wafer 700 (e.g., silicon carbide semiconductor wafer) according to example embodiments of the present disclosure. The scan pattern 718 has been adjusted, for instance, at point 718 from a first direction 720.1 to a second direction 720.2. In some embodiments, the scan pattern 718 may be adjusted, for instance, based on data associated with one or more workpiece properties. For instance, the scan pattern 718 may change directions to address high surface topographical areas (e.g., peaks) or other features on the surface of the semiconductor wafer 700. The scan pattern 718 may be adjusted based on other factors without deviating from the scope of the present disclosure.

FIG. 23 depicts an array of laser sources 810.1, 810.2, ..., 810.*n* providing emission of lasers 812.1, 812.2, ..., 812.*n* onto a surface 802 of a semiconductor workpiece 800 (e.g., silicon carbide semiconductor wafer) according to examples of the present disclosure. The laser sources 810.1, 810.2, ..., 810.*n* may each be configured to respectively emit a laser 812.1, 812.2, ..., 812.*n* in accordance with various laser parameters. The laser parameters may include, for instance, focusing depth, laser power, laser wavelength, laser pulse duration, laser pulse frequency, laser pulse energy, scan pattern, laser incidence angle, etc. The laser sources 810.1, 810.2, ..., 810.*n* may each be the same type of laser source or different types of laser sources. The laser sources 810.1, 810.2, ..., 810.*n* may be configured to emit lasers 812.1, 812.2, ..., 812.*n* in accordance with the same laser parameters or different laser parameters.

The laser sources 810.1, 810.2, ..., 810.*n* may be collectively controlled or independently controlled to implement a scan pattern 820 on the surface 802 of the semiconductor workpiece 800 to implement a laser-based surface processing operation according to examples of the present disclosure. For instance, each laser source 810.1, 810.2, ..., 810.*n* may be collectively controlled as a group or independently controlled relative to one another to provide individual scans 822.1, 822.2, ..., 822.*n* to provide a scan pattern 820 on the surface 802 of the semiconductor workpiece 800.

Each laser source 810.1, 810.2, ..., 810.*n* may be individually controlled to emit lasers 812.1, 812.2, ..., 812.*n* at different incidence angles (e.g., perpendicular or non-perpendicular incidence angles) relative to one another. For instance, laser source 810.1 may provide emission of a laser 812.1 at a first non-perpendicular incidence angle $\theta_1$. Laser source 810.2 may provide emission of a laser 812.2 at a perpendicular incidence angle. Laser source 810.*n* may provide emission of a laser 812.*n* at a second non-perpendicular incidence angle $\theta_2$ and from a different direction relative to the laser 810.1.

FIG. 23 depicts three laser sources 810.1, 810.2, ..., 810.*n* for purposes of illustration and discussion. Those of ordinary skill in the art, using the disclosures provided herein, will understand that the system may include more or fewer laser sources without deviating from the scope of the present disclosure.

Example aspects of the present disclosure are set forth below. Any of the below features or examples may be used in combination with any of the embodiments or features provided in the present disclosure.

One example aspect of the present disclosure is directed to a method. The method includes providing a semiconductor workpiece having a surface. The method includes providing emission of one or more lasers to the surface of a semiconductor workpiece at a non-perpendicular incidence angle relative to the surface. The method includes imparting relative motion between the one or more lasers and the semiconductor workpiece while providing emission of the one or more lasers to the surface of the semiconductor workpiece at the non-perpendicular incidence angle.

In some examples, the surface has a surface roughness of about 65 microns or greater.

In some examples, providing emission of the one or more lasers reduces a thickness of the semiconductor workpiece by at least about 25 microns.

In some examples, the semiconductor workpiece comprises silicon carbide.

In some examples, the semiconductor workpiece comprises an off-axis silicon carbide crystalline material.

In some examples, the surface comprises one or more step structures relative to a c-axis basal plane for the semiconductor workpiece.

In some examples, imparting relative motion between the one or more lasers and the surface includes imparting relative motion such that the one or more lasers scan the surface in a direction generally perpendicular to a direction associated with a length of the one or more step structures.

In some examples, wherein imparting relative motion between the one or more lasers and the surface comprises imparting relative motion such that the one or more lasers scan the surface in a direction that is not generally perpendicular to a direction associated with a length of the one or more step structures.

In some examples, providing the semiconductor workpiece includes separating the semiconductor workpiece from a boule using a removal process.

In some examples, providing emission of one or more lasers to the surface of a semiconductor workpiece at a non-perpendicular incidence angle relative to the surface increases a fracture strength of the semiconductor workpiece.

In some examples, the non-perpendicular incidence angle is about 75 degrees or less.

In some examples, the non-perpendicular incidence angle is about 30 degrees or less.

In some examples, the non-perpendicular incidence angle is about 15 degrees or less.

In some examples, imparting relative motion between the one or more lasers and the surface includes adjusting the non-perpendicular incidence angle of the one or more lasers while imparting relative motion.

In some examples, adjusting the non-perpendicular incidence angle includes adjusting the non-perpendicular incidence angle based on a number of scans of the one or more lasers.

In some examples, adjusting the non-perpendicular incidence angle includes adjusting the non-perpendicular incidence angle based on a workpiece property.

In some examples, adjusting the non-perpendicular incidence angle includes adjusting the non-perpendicular incidence angle based on a removal depth of the semiconductor workpiece.

In some examples, the method includes obtaining data indicative of a workpiece property.

In some examples, the method includes adjusting the non-perpendicular incidence angle of the one or more lasers based on the data indicative of the workpiece property.

In some examples, the method includes adjusting a scan angle of the one or more lasers relative to one or more topographic features on the workpiece surface.

In some examples, providing emission of one or more lasers includes providing emission of one or more lasers through one or more optics.

In some examples, imparting relative motion includes adjusting the one or more optics.

In some examples, providing emission of the one or more lasers reduces a surface roughness of the surface to a range of about 20 nanometers to about 65 microns.

In some examples, providing emission of the one or more lasers reduces a surface roughness of the surface to a range of about 0.5 nanometer to about 180 nanometers.

In some examples, the semiconductor workpiece is a semiconductor wafer.

In some examples, the semiconductor workpiece is a boule.

One example aspect is directed to a system. The system includes a laser source configured to emit a laser to remove material from a surface of a semiconductor workpiece at a non-perpendicular incidence angle relative to the surface of the semiconductor workpiece. The system includes at least one translation stage operable to impart relative motion between the surface of the semiconductor workpiece and the laser.

In some examples, the system includes a controller, wherein the controller is configured to adjust one or more of the laser source, the translation stage, or one or more optics to adjust the non-perpendicular incidence angle of the laser relative to the surface of the semiconductor workpiece.

In some examples, the system includes a sensor configured to obtain sensor data indicative of a workpiece property. In some examples, the controller is configured to adjust the non-perpendicular incidence angle based at least in part on the sensor data.

In some examples, the sensor is an optical sensor, a surface measurement laser, or an image capture device.

In some examples, the controller is configured to adjust one or more laser parameters based at least in part on the sensor data.

In some examples, the one or more laser parameters comprise one or more of laser power, laser pulse frequency, laser wavelength, laser pulse duration, focusing depth, laser pulse energy, scan pattern, or translation speed.

In some examples, the controller is configured to adjust the non-perpendicular incidence angle as a function of position of the surface of the workpiece.

In some examples, the semiconductor workpiece is a semiconductor wafer.

In some examples, the semiconductor workpiece is a boule.

Another example aspect of the present disclosure is directed to a semiconductor workpiece. The semiconductor workpiece includes silicon carbide. The semiconductor workpiece includes a laser-defined surface. The laser-defined surface includes one or more off-axis laser-defined features.

In some examples, of the one or more off-axis laser-defined features comprises a width, the width being in a range of about 10 microns to about 25 millimeters.

In some examples, each of the one or more off-axis laser-defined features comprises an ablated strip.

In some examples, the ablated strip comprises one or more asymmetric pulse spots.

In some examples, the laser-defined surface has a surface roughness in a range of about 0.5 nanometers to about 180 nanometers.

In some examples, the semiconductor workpiece comprises an off-axis silicon carbide crystalline material, wherein a surface of the semiconductor workpiece comprises one or more step structures relative to a c-axis basal plane for the semiconductor workpiece, wherein the plurality of off-axis laser-defined features each have a length extending in a direction that is generally perpendicular to the one or more step structures.

In some examples, the semiconductor workpiece has a diameter of about 150 millimeters.

In some examples, the semiconductor workpiece has a diameter of about 200 millimeters.

Another example aspect of the present disclosure is directed to a semiconductor wafer. The semiconductor wafer includes an off-axis silicon carbide crystalline material, wherein a surface of the semiconductor workpiece comprises one or more step structures relative to a c-axis basal plane for the semiconductor workpiece. A surface of the semiconductor workpiece comprises a plurality of laser-defined features, the laser-defined features have a length extending in a direction that is generally perpendicular to the one or more step structures.

In some examples, the semiconductor workpiece has a diameter of about 150 millimeters.

In some examples, the semiconductor workpiece has a diameter of about 200 millimeters.

In some examples, the surface has a surface roughness in a range of about 0.5 nanometers to about 180 nanometers.

In some examples, each of plurality of the laser-defined features comprises an ablated strip.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a surface of a semiconductor wafer comprising:
providing a semiconductor workpiece having a surface:
providing emission of one or more lasers to the surface of a semiconductor workpiece at a non-perpendicular incidence angle relative to the surface;
imparting relative motion between the one or more lasers and the semiconductor workpiece while providing emission of the one or more lasers to the surface of the semiconductor workpiece at the non-perpendicular incidence angle;
wherein the surface comprises one or more step structures relative to a c-axis basal pane for the semiconductor workpiece; and
wherein imparting relative motion between the one or more lasers and the surface comprises imparting relative motion such that the one or more lasers scan the surface at a scan angle relative to a direction associated with a length of the one or more step structures.

2. The method of claim 1, wherein the surface has a surface roughness of about 65 microns or greater.

3. The method of claim 1, wherein providing emission of the one or more lasers reduces a thickness of the semiconductor workpiece by at least about 25 microns.

4. The method of claim 1, wherein the semiconductor workpiece comprises an off-axis silicon carbide crystalline material.

5. The method of claim 1, wherein imparting relative motion between the one or more lasers and the surface comprises imparting relative motion such that the one or more lasers scan the surface in a direction generally perpendicular to a direction associated with a length of the one or more step structures.

6. The method of claim 1, wherein imparting relative motion between the one or more lasers and the surface comprises imparting relative motion such that the one or more lasers scan the surface in a direction that is not generally perpendicular to a direction associated with a length of the one or more step structures.

7. The method of claim 1, wherein providing the semiconductor workpiece comprises separating the semiconductor workpiece from a boule using a removal process.

8. The method of claim 1, wherein providing emission of one or more lasers to the surface of a semiconductor workpiece at a non-perpendicular incidence angle relative to the surface increases a fracture strength of the semiconductor workpiece.

9. The method of claim 1, wherein the non-perpendicular incidence angle is about 75° or less.

10. The method of claim 1, comprising obtaining data indicative of a workpiece property, wherein the method comprises adjusting the non-perpendicular incidence angle of the one or more lasers based on the data indicative of the workpiece property.

11. The method of claim 1, wherein the method comprises adjusting a scan angle of the one or more lasers relative to one or more topographic features on the workpiece surface.

12. The method of claim 1, wherein providing emission of the one or more lasers reduces a surface roughness of the surface to a range of about 0.5 nanometer to about 180 nanometers.

13. The method of claim 1, wherein the semiconductor workpiece is a silicon carbide semiconductor wafer or a silicon carbide boule.

14. The method of claim 6, wherein imparting relative motion between the one or more lasers and the surface comprises imparting relative motion such that the one or more lasers scan the surface in a direction generally parallel to a direction associated with a length of the one or more step structures.

15. The method of claim 6, wherein imparting relative motion between the one or more lasers and the surface comprises imparting relative motion such that the one or more lasers scan the surface in a direction that comprises a range of about 20 degrees to about 70 degrees relative to a direction associated with a length of the one or more step structures.

16. The method of claim 6, wherein the semiconductor workpiece comprises a laser-damage region resulting from removal of the semiconductor workpiece from a boule.

17. The method of claim 1, wherein the one or more lasers have a spot size in a range of about 10 microns to about 25 mm.

18. The method of claim 1, wherein the one or more lasers have a spot size such that there is about 0% to about 50% overlap of a scan dimension between passes of the one or more lasers.

19. The method of claim 1, wherein the one or more lasers have a focal depth beneath the surface of the semiconductor workpiece.

20. The method of claim 1, wherein providing emission of one or more lasers to the surface of a semiconductor workpiece at a non-perpendicular incidence angle relative to the surface comprises:
  providing emission of one or more lasers at a first non perpendicular incidence angle; and
  providing emission of one or more lasers at a second non perpendicular incidence angle, the second non-perpendicular incidence angle being different from the first non-perpendicular incidence angle.

\* \* \* \* \*